(12) United States Patent
Bruwer et al.

(10) Patent No.: US 9,209,803 B2
(45) Date of Patent: Dec. 8, 2015

(54) INTELLIGENT CAPACITIVE SWIPE SWITCH

(76) Inventors: Frederick Johannes Bruwer, Paarl (ZA); Jacobus Daniël Van Wyk, Paarl (ZA); Gerrit Johannes De Villiers, Paarl (ZA); Brandt Aucamp, Paarl (ZA)

(*) Notice: Subject to any disclaimer, the term of this patent is extended or adjusted under 35 U.S.C. 154(b) by 108 days.

(21) Appl. No.: 14/241,025

(22) PCT Filed: Aug. 24, 2012

(86) PCT No.: PCT/ZA2012/000054
§ 371 (c)(1),
(2), (4) Date: May 13, 2014

(87) PCT Pub. No.: WO2013/033735
PCT Pub. Date: Mar. 7, 2013

(65) Prior Publication Data

US 2014/0292396 A1 Oct. 2, 2014

(30) Foreign Application Priority Data

Aug. 26, 2011 (ZA) .................................. 2011/06274
Oct. 3, 2011 (ZA) .................................. 2011/07198
Mar. 27, 2012 (ZA) .................................. 2012/02230
May 28, 2012 (ZA) .................................. 2012/04117

(51) Int. Cl.
*H03K 17/96* (2006.01)
*H03K 17/955* (2006.01)

(52) U.S. Cl.
CPC ............ *H03K 17/962* (2013.01); *H03K 17/955* (2013.01); *H03K 2217/94052* (2013.01)

(58) Field of Classification Search
CPC .................... H03K 17/962; H03K 2017/9613; H03K 2017/9615
See application file for complete search history.

(56) References Cited

U.S. PATENT DOCUMENTS

| 6,879,930 B2* | 4/2005 | Sinclair et al. ................. 702/150 |
| 8,415,959 B2* | 4/2013 | Badaye ......................... 324/658 |
| 8,547,116 B2* | 10/2013 | Togura et al. ................. 324/679 |

* cited by examiner

*Primary Examiner* — Jeffrey Zweizig
(74) *Attorney, Agent, or Firm* — William A Blake

(57) ABSTRACT

A capacitive sensing-based electronic switch, which incorporates an integrated circuit with processing capability, which can only be activated by user action in a dedicated area, whereby switch activation occurs only if, at least, a touch is capacitively sensed and criteria based on timing plus sequential touches on capacitive sensors are satisfied.

20 Claims, 12 Drawing Sheets

INTELLIGENT CAPACITIVE SWIPE SWITCH

BACKGROUND OF THE INVENTION

This invention relates generally to improved electronic switches, and specifically to those incorporating capacitive sensing technology, and to the manner in which an activation or operation event is defined.

In recent years, electronic products have increasingly incorporated intelligent switches to realize more functionality than a simple on/off action. One area where this is especially evident is in portable lighting products, such as headlamps, key-ring lights and torches, although certainly not limited to this field only. Due to inventions such as that contained in U.S. Pat. No. 6,249,089 to Bruwer, more and more products now have features previously only realizable with a more complex user interface. However, a large number of these implementations still make use of mechanical structures to make or break current, be it push buttons, tactile dome switches or large pole type structures. Such mechanical switches may suffer from a number of drawbacks. They can be prone to wear and tear. It can be costly to manufacture them in a robust/rugged manner which is immune to harsh environment use. To realize a waterproof product may require a dedicated flexible membrane over the mechanical switch, with all the associated challenges and cost implications.

Capacitive sensing technology has also increased in prevalence recently. One of the more evident fields of deployment is in mobile telephones and laptop computers. However, inherent to the technology is the possibility of inadvertent activation. This, coupled with the universal user requirement of haptic feedback on switch location, has possibly kept capacitive switches out of a large number of possible applications, notably the above mentioned fields of portable lighting and automotive controls. Only placing a typical capacitive sensing switch in a recess does not solve the problem of inadvertent activation satisfactorily. A user's clothing, or other dielectric objects, might penetrate the recess and activate the switch.

The invention disclosed hereafter purports to overcome the drawback of inadvertent activation, thereby allowing use of capacitive switching technology in fields heretofore unattractive for some reason, and to overcome some of the drawbacks of mechanical switches.

SUMMARY OF THE INVENTION

In its simplest form the present invention may be viewed as a capacitive sensing based electronic switch which incorporates an integrated circuit with processing ability, and that can only be activated or operated by a user action in a dedicated area. That is, switch activation/deactivation only occurs if more than one criteria are satisfied, with a capacitively sensed touch being at least one of the criteria, and timing plus sequence of sequentially sensed touches on different capacitive sensors or sensed channels being at least another, with circuitry integral to the switch performing processing of measured data and filtering according to the relevant criteria.

The present invention further comprises a user interface by which the user may select various operating modes or functions. Similar to intelligent switches of the prior art, disclosed in patents such as U.S. Pat. No. 6,490,089, U.S. Pat. No. 7,084,526 and U.S. Pat. No. 7,265,494 awarded to one of the present inventors, the user interface of the present invention may be defined by the electronic switch and the manner in which it is operated within a certain period of time. The circuitry integral to the embodiment of the present invention typically monitors the inherent capacitive sensing electrodes, and applies time and sensed capacitance based filtering algorithms to establish the intention or mode/function selection of the user, as described hereafter during disclosure.

A typical two channel Capacitive Swipe Switch (CSS) according the present invention monitors the sensed capacitance of the two channels. If the capacitance of only one channel changes significantly from the reference value, a possible swipe action detection algorithm may be started. (In capacitive sensing technology, a reference value is established by calculating the average of the measured capacitance over a certain period. This reference value is then used to compensate for environmental changes. The reference value is also known as the Long Term Average or LTA). To successfully detect and annunciate a swipe action, the capacitance change of the one channel typically needs to be accompanied by a specific, subsequent capacitance change at the other channel, within certain timing constraints. It is possible to realize two channel surface capacitive sensing or two channel projected capacitive sensing swipe switches according the present invention.

The number of capacitance sensing channels used to implement a CSS according the present invention need not be constrained to two. For instance, if three surface capacitance measurement channels are used, a swipe action may typically be identified by a first channel experiencing touch indicating capacitance change, followed by touch indicating capacitance change at the center channel and then at the third channel, all subject to certain timing criteria. The capacitance decrease at each channel may be accompanied by a capacitance increase at a subsequent channel in the perceived swipe direction. For instance, if a charge transfer sensing process is used in the afore-mentioned three surface channel CSS, the following should typically occur if a swipe is made from left to right. First, the counts of all channels should be proximate to the reference value. As the user touches the left-hand sensor, its counts may decrease correspondingly, while the center and right-hand sensor counts should remain relatively high. As the user moves his/her finger to the right, the counts of the center sensor may start to decrease, as the left-hand sensor counts increase. With the user finger over the center sensor, its counts should be at a minimum, indicating a touch, and if the structure is symmetric, the counts of the left- and right-hand sensors should equally deviate from the reference value. As the user finger moves toward the right-hand sensor, the counts for the center electrode should increase, and that of the right-hand sensor should decrease correspondingly. If the above sequence occurs within certain timing constraints, a swipe action may be annunciated. The timing constraints may determine the allowed range in speed over the sensors.

The above exemplary three sensor surface CSS may also be implemented with projected capacitance sensing technology, according the present invention, with the associated changes in capacitance and counts.

Proximity sensing may be used to identify the possible intention of a user to start a swiping action, and what the starting point and direction will be, according the present invention. As the user finger approaches one of the sensors of the CSS, the capacitance of the particular sensor should start to change well in advance of a physical contact event. With adequate sensitivity, this change may be used to sense user approach and activate visual, audible or haptic indicators to inform the user of the product status, and/or to wake the system from a standby or low power mode.

In step with the main goal of the present invention to prevent inadvertent activation, active driven shields or grounding may be used with the CSS. Grounding or active shield electrodes may be realized on both sides of the CSS, preventing inadvertent activation from a direction orthogonal to the preferred swipe directions. Alternatively, active driven shield or ground electrodes may be placed on all four sides of the CSS. This should demarcate the area wherein swipes will be accepted more effectively.

A further measure disclosed by the present invention to prevent inadvertent activation is to place the CSS within a recess or trough substantially lower than the surface of the product hosting it. To activate the CSS, a user has to place his/her finger within the recess and perform a swiping action within certain timing constraints. This should reduce the chances of inadvertent activation significantly, since contact with the flat surfaces of the product above the recess should not result in a contact detection hence lowering the probability of an accidental swipe activation dramatically.

Yet another method of the present invention to prevent inadvertent activation is to essentially combine two CSS's into one unit, and to test for simultaneous swipes in opposing directions, as typically obtained in a pinching movement by a user's fingers. For example, the user may place two of his/her fingers at the outer edges of the CSS, in a lengthwise sense. By moving his/her fingers simultaneously towards each other, two simultaneous swipes may be effected. For a surface capacitance implementation, the counts of subsequent sensors along the paths of the swipes should decrease to a minimum, followed by a return to the reference count value. If the CSS tests for the above, subject to certain timing requirements, a double swipe or pinching movement may be detected. The chances of illegal dielectric probes or material performing this action within the timing constraints should be very low, which improves immunity to inadvertent switch activation.

Since the present invention needs to maintain the functionality and intelligence of any prior art switches it might replace, a method is required to enter or program specific modes of operation for the product containing the CSS. It is proposed that this may be achieved by testing for a certain amount of complete swiping actions within a specific period, or for a specific delay between subsequent complete swiping actions, or for a specific swipe direction or for a combination of the three methods. In a further embodiment a user may swipe the recessed CSS to switch the hosting unit on, and then use simple touch gestures on any or a specific part of the CSS to step through available modes. A second swipe may be used to exit the mode selection. Alternatively, if a specific period elapses after the last touch or swipe action, the unit may automatically exit mode selection, requiring a new swipe to enter it again, or to switch it off. According the present disclosure, it may also be possible to use a specific swipe gesture made on the CSS to enter a setup mode for the product containing said CSS. Once in a setup mode, touches on any number of electrodes of the CSS may be used to select certain operating parameters for the product, which may then be stored in non-volatile memory. Once the setup mode is exited, in a manner as described above, the power to the product may be removed without loss of the setup stored in the memory.

In one embodiment of the present invention, dual loads (e.g. two types of light sources like spot/diffused or white/red) L1 and L2 may be controlled with one CSS. For example, from an OFF state, a swipe in a particular direction, for example Left to Right (LTR) will switch load 1 (L1) ON. Further LTR swipes may result in different modes of L1 being selected (dimming, flash, OFF etc). A swipe from Right to Left (RTL) at any time will typically result in L1 being turned OFF. In a further embodiment a swipe LTR after a predetermined period (T1) of inactivity on the switch (e.g. 1.5 seconds), will also result in an OFF condition.

To control load L2 a user may, from an OFF state, perform a RTL swipe gesture over the same CSS, which may result in load 2 (L2) being turned ON. Similar to the control for L1, further RTL swipes within the period T1 may result in different operating modes of L2 being selected. When load 2 is activated, a swipe from LTR at any time will result in L2 being switched OFF.

Once either load is switched on with a LTR or RTL swipe, an extended period of touch within period T1 (or any other period if so selected) on an electrode or on multiple electrodes of the switch may result in a gradual dimming function or other mode change being selected. For example, a touch on the left side may increase light intensity and a touch on the right side may dim the light output. In some embodiments a touch after a period where no switch activity occurred may result in no change in the function, status or condition of the product.

The above disclosed teaching of the present invention on swipe direction based control need not be constrained to dual loads, but may be applied to a single load as well (for example, but not limited to, a single LED light source). In such an embodiment of the present invention, a swipe in the LTR direction may control said single load in a manner similar to that disclosed above. However, a swipe in the RTL direction may then:

1. Be ignored to reduce probability of false activation.
2. Result in low power activation of load.
3. Result in flashing or emergency mode activation.
4. Activate an auto off mode, i.e. will switch off after a predetermined period of time, with or without an auto-off warning. In some embodiments a touch or proximity event detection in the period wherein or after the auto off warning was given will reset the auto off timing.

Further, if the above disclosure of dual load control with a single CSS according the present invention is embodied in a product such as a headlamp, the swipe switch activation mechanism may be indicated to the user with a dual direction arrow. And if L1 is a white and L2 is a red light, then half of the arrow in the direction required to switch L1 on may be white in color and the other half of the arrow, in the direction required to switch L2 on, may be red in order to clearly indicate the functionality to the user. A similar graphical guide may be used to indicate flashing functionality to the user, where the half arrow in the direction required to select a flashing mode may be broken. The concept is to use the directional designation to clearly indicate the function to the user in the arrows or at the end of the arrow.

The presently disclosed invention also teaches that unique locking and unlocking functions may be implemented with a CSS, as follows—after the device is turned OFF, (or for example ON then OFF) and the electrodes (or a specific electrode) is touched for an extended period or in a specific sequence (for example 1, 3, 2) the load will momentarily activate and then the product cannot be activated with the normal procedure. I.e. a more elaborate or secure activation procedure is required. To unlock an extended period of touch may be required on an electrode (or any electrode). This may be advantageous as the sleep time between measurements may be extended to improve (decrease) power consumption. That is, the capacitive measurement circuit may have a slower response time, thus reducing power consumption, and still detect the extended period of touch required for unlocking. The product may react with an indication to the user (for example a light source may flash) of the start of a time window after which a swipe action or actions within a predetermined period, and in a specific direction or directions is required to unlock the switch. A locking function as disclosed has advantages in terms of power consumption and guarding against unwanted activation whilst a product is packaged for example.

In another embodiment, if a sequence of electrode touches followed by a valid swipe is required to lock or unlock, they may be individually (in sequence) indicated with backlighting to guide the user. Locking and unlocking functionality as disclosed may find good application to various products such a personal products (e.g. toothbrush, shaver, hairdryers), head lamps, key chain lights, automotive interior lights, flash lights, home light switches, fans, cook tops or hubs, kettles, clothing irons and power tools. Incorporation of the disclosed locking and unlocking functionality in products where safety is a concern may prove especially advantageous.

Another possibility for application of the capacitive swipe switches according to the presently disclosed invention is in remote controls. For example a remote control may select between TV and audio, or may in fact have two swipe switches forming a cross, where the four directions each select a specific product or function. This configuration may be useful for other products and function selections as well.

Having a swiping action available as well as dedicated touches, the present invention may allow for realization of more intelligent switches than in the state of the art. In prior art, the only parameters from which to determine the user's intention were the switch state, the period between subsequent state changes, and the number of times a state change has occurred for a specific switch. By including the difference between a simple touch and a swipe, and the swipe direction, it is clear that significant options and interfacing capabilities may be added at very low cost.

For example, a CSS may be used in a product such as any toy, light (flash light, flash clip etc) or other consumer product to implement a demonstration mode. I.e. a function can be activated on a temporary basis when the product is in its packaging and when taken out of the packaging the normal functionality can be easily installed or activated. That is, only unlatched activation of a load for the duration of a touch on a sense electrode can be performed while the product is in its undamaged packaging used for distribution and sales. For example the commercial packaging (clam shell) may be such that only a single electrode can be touched, hence a swipe action cannot be completed by the user.

In the demonstration mode a touch may, for example, activate the LED of a flashlight or flash clip type product. When the touch is removed, the LED is switched OFF. However, when removed from the packaging, a first swipe action may restore normal activation (without requiring a touch to stay ON) and disable the demonstration mode.

As a CSS according the present invention is a capacitive or other form of sensing device, without any mechanically moving parts, it should to a large extent overcome the wear and tear drawback of traditional mechanical switches. Further, it should be possible to enclose the CSS completely within a fairly thick dielectric layer, significantly enhancing ruggedness at very low cost. Because no moving parts are required, waterproofing of products utilizing a CSS should become very simple.

Due to these enhancements, CSS technology disclosed by the present invention should find natural application in a large number of fields. The below examples are given in an exemplary manner, and should not be construed as limiting in any way.

In portable lighting devices such as key-ring lights and torches, a recessed CSS according the present invention may work well. By removing the requirement for a mechanical switch, which may require movement through the casing (using rubber or other soft membrane), the cost of product housings for these two and other applications may be significantly reduced, while increasing waterproofing, durability and ruggedness. If a CSS is used to replace the traditional pushbutton of a headlamp, a recess is not necessarily required, although it may offer further protection against accidental activation when the product is packed with other items, for instance in a backpack or suitcase. In addition, during normal headlamp operation, users typically want to adjust the beam angle of the headlamp. This may be done by gripping the headlamp between thumb and forefinger, and tilting the unit up or down. In such, and other, instances the addition of a blocking sense channel to the CSS might be beneficial. For instance, if the sensor of the blocking channel is placed where the user will place his/her thumb during headlamp adjustment, it may be used to alert the CSS that the present touch on the CSS is not a swipe attempt, and should be ignored. This is just an example of blocking channel use, and should not be considered to be limited to headlamps. The additional channel may just as easily be used as an enabling channel. For example, a key-ring light may have a sensor on the opposite side of the swipe sensors. As the key-ring light or flash clip is typically touched on both sides when activated, a touch on one side may be a requirement for a swipe detection and annunciation.

In the application of the present invention to portable lighting products, capacitive sensing may be utilized to determine the manner in which the product is being held, or worn, and adjust functionality accordingly. For instance, capacitive sensing may be utilized to determine whether a user is wearing a headlamp on his/her head. If this is found to be the case, the Battery Power Monitor (BPM) functionality of the headlamp may be adjusted to provide an indication of remaining battery power by flashing the main light of the headlamp in a specific manner, as opposed to activation of BPM indicators situated on the body of the headlamp, as is often done in prior art headlamps. By flashing the main light of the headlamp, the user is provided with visual BPM feedback which does not require removal of the headlamp to view it, unlike the traditional BPM indicators contained on the body of headlamp.

Another application of the technique disclosed above may be found in portable music players used while exercising. By capacitively sensing that the player is, for example, strapped to the user's arm, or hip, audible feedback may be provided to the user as he or she operates the device, negating the requirement for the user to look at the display of the device, which may be impractical or distracting while exercising. For example, this may enable rapid selection of a preferred song or setting, without having to listen to short sections of music before a selection can be made.

Another advantage of a recessed CSS is that it may provide a haptic indication to a user attempting to find the switch while wearing thick gloves, often the case in outdoor environments. In headlamp applications, such haptic feedback may be also be provided by placing the electrodes of the CSS underneath the edge formed where slanting and horizontal or vertical outer surfaces join. Alternatively, the CSS electrodes may be placed within the headband of the headlamp, requiring the user to make swipes over the headband material, as not much haptic sensitivity is required to differentiate between the body of a headlamp, and the headband.

The present invention may also be deployed in automotive applications. For example, a recessed CSS according the present invention may work well to replace the traditional mechanical switches used to control window height. Normal capacitive sensing switches are typically not used for this application, since window control buttons are typically contained within door handles or arm rests, and inadvertent activation by the user's arm is likely. In addition to improving durability, waterproofing and increased immunity to inadvertent activation, a recessed CSS according the present invention may also improve ease of use and functionality. For example, if the user wants to lower the window, a light swiping action, which may require very little exerted force, may start the action. Once the window is at the preferred height, a second swipe or touch may halt window descent. Alternatively, the user may swipe and hold his/her finger on the CSS, and the window descent may be halted when the user removes his/her finger. Or the user may start with two brief swipes to lower the window completely. This method of operation may also apply to raising the window, with the controller keeping track of the window position. Alternatively, a swipe in a direction may start the window in a direction (up/down), and then a touch on a specific sensor may cause further movement in a specific direction. It should be noted that the above exemplary embodiment where a user swipes and holds his/her finger, and then removes it after a certain time to lower or raise a window to a specific point is similar to a scroll gesture performed with a user input device such as a computer mouse, where a user clicks, drags and releases, and the teachings of the present invention are not limited to control of an automobile's window height. For example, such a swipe, prolonged touch and release gesture may also be performed on a small button, on the order of 6 mm by 6 mm, and which contains a CSS with only two or three electrodes per dimension (for e.g. up/down), to perform a scrolling function which may be used to navigate through a list of items displayed by a mobile electronic device. Said CSS may further be used to determine any or all of the following: direction of a swipe, speed of a swipe, length of a swipe and repetition rate of swipes In automotive window controls, the arm rest or another surface close to the driver often contains switches to control all of the windows in the vehicle. According the presently disclosed invention, this large number of mechanical switches, typically expensive, may be replaced with a single CSS unit, which may be recessed, and a number of recessed single channel touch switches. The single channel touch switches may or may not use actively driven shields that may be situated on the upper surface of the material into which said touch switches are recessed, or areas of conductive material which are grounded. Due to their recessed nature, and the possibility of actively driven shields, or grounded material, guarding them, the chances of inadvertent activation of said single channel touch switches should be fairly small. But even if they are inadvertently activated, no window repositioning should result, as will become clear from the following disclosure of typical operation. To lower a specific window, a user may activate the corresponding single channel touch switch by inserting his/her finger into the recess. This typically needs to be followed by a swiping action on said CSS unit within a specific period. The swiping action may be used to confirm the touch on the single touch switch, and that a window repositioning needs to be done, or it may be used as confirmation and for a complete window repositioning in the direction indicated by the swiping action. E.g. if the swiping action was in a first direction, the window may be completely lowered, and if the swiping action was in a second direction, in opposition of the first direction, the window may be completely raised. In another exemplary instance, the swiping action may be followed by a partial swipe, or touch to the corresponding single touch switch, to lower or raise the window. Once the user moves his/her finger away from the CSS or single touch switch, the window repositioning is terminated. According to the present invention, it may be possible to realize the above disclosed control of automobile window position using surface capacitance sensing, projected capacitance sensing, a combination of surface and projected capacitance sensing, charge transfer based measurements, other capacitive sensing techniques or other sensor technologies, such as IR sensing, piezoelectric sensors, heat sensors etc. Further, a large number of operational combinations with touches on said single sensors and touches or swipes on said swipe action based switch is possible that still fall within the scope of the presently disclosed invention.

It may further be possible to realize simple touch switches which utilize specific recess characteristics to prevent inadvertent activation, according the present invention. For example, if two surface capacitance electrodes are placed in an oval recess which is formed in such a manner that the electrodes are covered by the lip of the recess, with actively driven shields, or grounded conductive material, that may or may not be placed on the outer surface of the material which contains the recess, inadvertent activation may become very difficult. To activate the switch via either of the two channels, the engaging probe need not only be inserted vertically into the recess, but also angled to engage the respective electrode underneath the lip of the recess. The chances of illegal material or probes performing this action should be quite small. The above disclosed two channel recessed switch may be used effectively in the control of automotive vehicle window height. To lower a specific window, the user inserts applies his/her finger into the corresponding recess, and for example angles it backwards and apply pressure with his/her fingertip onto the area underneath the recess lip that contain the first electrode. To raise said window, the user will typically insert his/her finger into said recess, angle it forwards and apply pressure with his/her fingertip onto the area containing the second electrode. Due to the actively driven shield, or grounded, material on the outer surface of the material containing the recess, the user may engage said outer surface without activation of the touch switch. Further, according to the present invention, a blocking electrode may be placed in the center of the recess, at its lowest point. If a user inserts his/her finger, or another legal probe, vertically into said recess, the blocking electrode is engaged, and any change in window height is not permitted. If the user angles his/her finger forwards or backwards, the blocking electrode is not engaged anymore, and window height may be changed, depending on which of the two electrodes situated underneath the overhanging lips of the recess is engaged. The preceding disclosure may work well to replace prior art mechanical switches typically contained in vehicle arm rests. The above example is purely provided for illustration, and should not be considered as limiting. Other implementations, for instance using projective capacitance sensors, or other sensing technologies, or other recess shapes, are possible according the present invention.

In yet another embodiment of the invention being presently disclosed, use may be made of a single channel capacitive sensor, or a sensor based on another technology, in a simple recess to form an electronic switch for a product which may have high immunity to inadvertent activation. Active driven shields, or grounded conducted material, may or may not be used on the surface of the material in which the recess exists. To operate said switch, the user needs to insert an engaging probe, which may or may not be his/her finger, or another member, into said recess, and physically contact or be in close proximity to the electrode of said single channel sensor for a sufficient period. Such an embodiment may find good application for example in an automotive vehicle, and specifically to operate the interior light often situated on the ceiling of the vehicle's roof. Typically, a user needs to reach backwards with his/her hand to operate said interior lights of the prior art. If the user is the driver of the vehicle, and struggles to find the mechanical switch of prior art interior lights, this may cause distraction, with road safety implications. An interior light utilizing an electronic switch with a single channel sensor within a simple recess, as disclosed, may assist the user with improved haptic feedback, as recess may be more easily identifiable by touch alone. Further, it may be possible to use proximity sensing to visually indicate said interior light, or other devices containing such a recessed switch, to users other than the driver of said vehicle.

Other automotive CSS applications that come to mind, in no limiting manner whatsoever, are control of interior lights, audio visual controls and GPS controls. All of these automotive applications are not critical controls, but should they malfunction due to inadvertent activation could distract drivers, with possible fatal consequences. To a certain extent, recessed CSS's should therefore improve the state of the art of automotive safety. For instance, it may be easier to accidentally bump a mechanical audio control to a maximum setting with a waving/moving hand, than to swipe a recessed CSS in specific manner, or repeat a number of swipes, to achieve the same result. The CSS type operation may also be employed specifically for speed control, audio system control and other controls typically found on a vehicle steering wheel.

All of the above automotive applications may also benefit from the inherent waterproofing of a CSS according the present invention, as it could be easier to clean and easier to manufacture.

Capacitive Swipe Switches according to the present invention may also be incorporated in consumer products such as electrical toothbrushes, shavers, toys, hair dryers, kitchen appliances, washing machines and fridges. All of these are listed in an exemplary manner, and the list should by no means be seen as exhaustive or limiting. For instance, in a hair-dryer, a CSS may be used to increase safety. If a normal capacitive switch is used, a small child might operate the hair drier by mistake, and cause damage or injury. However, if a recessed CSS is employed that requires a very specific sequence of swipes, the chances of a child recreating this sequence by mistake may be small.

Electrical toothbrushes and shavers may not only benefit from the inherent waterproofing of a CSS according to the present invention, but also from the reduced risk of inadvertent activation when the units are transported etc.

Another potential application field for CSS may be extremely low cost digital music players. To date, these have employed push-button or prior art capacitive sensing switches. As such, to enable the user to carry the unit in his/her pocket or bag without inadvertent activation, a dedicated key-locking mechanism may be required. If CSS's are employed in such devices, having dedicated key-locking mechanisms may become obsolete, resulting in a simpler implementation and lower possible cost.

Yet another possible application of a CSS according to the present invention is in small form factor mains power supply units, such as those typically used to charge portable devices, for instance, but not limited to, mobile telephones, digital cameras, laptop computers, e-book readers etc. Often, users may leave the power supplies plugged into a multi-plug mains socket after removing their fully charged portable device. But due to other devices still plugged into the multi-socket, the wall switch may not be set to the off position. This may result in the power supply wasting power unnecessarily in a standby condition. Alternatively, users may plug their power supplies out to avoid wasting power in standby. However, this may require going through the trouble of finding the correct power supply and plugging it in again if the specific portable device needs to be recharged. If Capacitive Swipe Switches are incorporated into such small form factor portable mains power supplies, users may easily and safely switch the power supply into an extremely low power state once the portable device has been fully charged and unplugged. Further, due to the inherent isolation of a CSS, it may be possible to add a programmable user interface at low cost to small form factor mains power supplies, which may improve their user friendliness, safety and efficiency.

The present invention further teaches the use of specific surface patterns for the dielectric used as isolation between the touching object, typically a user's finger, and the capacitive electrodes inherent to the electronic switches presently being disclosed. These surface patterns may be used to improve user guidance, provide haptic feedback and decrease the risk of inadvertent activation. In a first exemplary embodiment, the pattern typically consists of a plurality of ridges, possibly rounded on top, with height much smaller than the typical width of a user's finger, said ridges traversing the length of the CSS in a direction parallel to the required swiping direction, and spaced apart over the capacitive electrodes in a direction orthogonal to the required swipe direction. The plurality of ridges that lie parallel to the required swipe direction may be combined with a plurality of ridges on both sides which are diagonal to the required swiping direction, and of which the diagonal angles are opposing, to form the disclosed pattern. The diagonal ridges have sides which may be slanted when approached in a direction similar to the required swiping direction, and which are essentially vertical when approached in a dissimilar direction. It is also within the scope of the present invention to possibly make said diagonal ridges higher than the parallel ridges, and let the height of the diagonal ridges decrease towards the parallel ridges, thereby possibly forming a guiding slope towards the parallel ridges. The surface pattern as described above should intuitively guide a user to the location of the CSS, and the required swiping direction. If a user swipes his/her finger in a direction dissimilar to the required swiping direction, the diagonal ridges should provide increased impediment to the action, due to their diagonal angle and encountered vertical sides.

In a second exemplary embodiment of the disclosed surface patterns, the center of the CSS, in a lengthwise sense, is marked by change in the angle of the diagonal ridges of typically ninety degrees or more. This change occurs simultaneously on both sides of the CSS and the parallel ridges. Therefore a user may be assisted in determination of the center pint of the CSS via tactile feedback. This may be helpful if the user needs to activate specific touch electrodes, but do not have visual feedback to place his/her fingers in an exact manner.

A third exemplary embodiment of dielectric surface patterns, as disclosed by the present invention, comprises the use of elevated ridges which flare at both lengthwise ends of the CSS. These ridges form a funnel like structure at the entry and exit points for the CSS. In addition, their height may slowly increase from their distant ends to a maximum point in juxtaposition with the first/last capacitive electrodes. This is accompanied, in a width sense, by a sharply angled slope on the inner side which faces the capacitive electrodes, and a low angled slope on the opposing, outer sides. If a user finger approaches the CSS with such a surface pattern arrangement, it may be guided in an intuitive way to the required swipe location, and possibly direction.

In yet a fourth exemplary embodiment of dielectric surface patterns to enhance Capacitive Swipe Switches, according to the present invention, a CSS and surface pattern may be realized which comprise a 180 degree direction reversal. A plurality of ridges which lie parallel to the required swiping direction are enclosed on both sides by ridges which are diagonal to the required swiping direction, as disclosed above. However, the required swiping direction changes by 180 degrees along the course of the CSS. The parallel and diagonal ridges also reflect this direction change, thereby guiding the user's finger along the required swipe path. Such a direction reversal in the required swiping action should substantially improve the immunity of the CSS to inadvertent activation.

Another exemplary embodiment of the present invention utilizes the above disclosed guided direction reversal in conjunction with four or more capacitive sensing channels and ridge patterns in the surface of the dielectric between the engaging probe, which may be a user's finger, and the sensing electrodes. Such an embodiment may enable the realization of two of more secondary, independent CSS units within a primary CSS unit that contains four or more sensing channels. The ridge patterns, similar to that disclosed in the previous discourse, guide the engaging probe, which may be a user's finger, along a path which experiences a full or partial reversal in direction. Should the engaging probe form a complete swiping action, or other required action, along the required path, including full or partial reversal in direction, the two or more secondary CSS units may be unlocked or enabled for operation. The user may then use an engaging probe, which may be his/her finger, to operate each of the secondary CSS units independently, in a manner similar to that disclosed earlier by this application. A second activation of the primary CSS, along the required direction reversal path, guided by said surface ridge patterns, may be used to disable or lock the secondary CCS units. Many other implementations similar to the immediately disclosed exemplary embodiment may be possible according to the presently disclosed invention, for instance, but not limited to, using other sensing technologies or more sensing channels, or other geometric patterns and required direction changes.

In yet another exemplary embodiment of the presently disclosed invention, a mobile telephone's on-ear detection capacitive sensing electrodes are replaced with a CSS, as taught in the preceding discourse. Typically, such on-ear detection capacitive sensing electrodes are used to detect when a user places his/her mobile telephone against his/her ear after answering a call. Once said placement has been detected, the visual interface of the telephone may be turned off, to conserve power, as it is generally not possible for a user to view the visual interface while the phone is close to his/her ear. Or the on-ear detection may be used to ignore inputs to the user interface while the phone is placed on or close to the user's ear. However, by replacing the traditional on-ear capacitive sensing electrodes in a mobile phone with a CSS, as taught by the present invention, an advantageous integration of functionalities may be realized. Most state of the art mobile telephones have some sort of method or mechanism by which to lock the user interface of said telephones. In such a locked state, all or most inputs to said interface is ignored, to avoid unintended activation of phone functions, for example while being carried in a user's pocket, or bag. Said mechanisms or methods include pressing a specific sequence of buttons, dragging an icon on a touchscreen to a specific location or executing a previously registered gesture on a touchscreen. Although these work well, they exhibit some drawbacks, for instance it may be difficult for the user to remember said sequence of button presses, and the display of an icon consumes additional power. By integrating the functions of on-ear detection and a locking/unlocking mechanism, through the use of a CSS, the user only has to remember to make a swipe movement at a location close to the speaker of the phone, and due to the extremely low power consumed by typical CSS Implementations, very little power may be consumed to test for possible unlocking events while the mobile telephone is in a locked state. Further, by placing one of the electrodes of the CSS closer to a specific area of the telephone, for instance closer to the touchscreen, if employed, it may be possible to prevent inadvertent activation of the locking/unlocking functionality during normal telephone use, by using said electrode as a blocking electrode. That is, if a specific change in measured capacitance only occurs for the blocking electrode, and not for the other electrodes of the CSS, a change in the logic state of the CSS output is prohibited.

As briefly discussed earlier, the present invention teaches that a small CSS based button may be realized, with typical surface area on the order of 6 mm by 6 mm. Such a button may use only two or three electrodes per dimension (for e.g. up/down) and capacitance measurements, for example, but not limited to, surface capacitance or mutual capacitance measurements, to detect and validate user swipe gestures, to determine the direction of a swipe, to determine speed of a swipe, to determine length of a swipe, to determine repetition rate of swipes, to detect user proximity gestures, to detect user touch gestures which are essentially static in location and exert less than a specific predetermined minimum pressure, and to detect user touch gestures which are essentially static in location but exert pressure equal to or more than a predetermined minimum value. Further, the present invention teaches that a conventional electrical contact make/break means or a capacitance measurement may be used to detect said user gestures which exert more than a minimum pressure, and that tactile feedback may be provided upon occurrence of such gestures, similar to a click experienced with conventional snap dome electromechanical buttons. The present invention further teaches that said CSS used in said button may have sufficient resolution, while employing a minimum number of capacitance sensing electrode structures, to detect capacitance changes due to the ridges and valleys of a user's fingerprint. The teachings of the invention disclosed in provisional filing ZA 2012/05814, titled "Fingerprint based capacitive motion sensor" by the present inventor, and hereby incorporated in its entirety, may be used to realize such a CSS based button which can discern motion of fingerprint ridges and valleys.

According to the present invention, it is envisaged that a small CSS button as disclosed above may be used on a mobile phone, with said button located on the side of said mobile phone, for example. To adjust volume up or down during a call, a user may simply swipe his/her finger over said CSS button. So select a particular function, for example to end a call, the user may depress said CSS button with more a predetermined minimum pressure until tactile feedback similar to a click is received. In addition, said CSS button may be used to scroll through a list of displayed items by performing a partial swipe gesture, and pausing on the CSS button with a prolonged touch. Once a preferred item or location in said list is reached, the user may simply press said CSS button with more than a predetermined pressure to select. Alternatively, a user may navigate a displayed list of items by a number of consecutive swipes, within a certain period, in a particular direction. The present invention further teaches that said user may use a number of consecutive swipes in a particular direction to control movement of a displayed cursor or pointer, wherein each detected swipe results in a step by said cursor or pointer in the direction of said detected swipe. Tap and double tap gestures may also be used, according the present invention, to select displayed items that was highlighted on the screen using the electronic capacitive swipe switch. In fact, a rich collection of user interfacing gestures may be facilitated by a CSS button as disclosed by the present invention, given the possible combinations of a simple touch, a valid swipe in one or the other direction, taps, double taps and gestures with more than a predetermined minimum pressure. Naturally, application of a CSS button as disclosed is not limited to mobile phones, but may be advantageously applied to a large number of other products, for example tablet and laptop computers, e-readers, white goods such as washing machines, fridges, audio-visual systems and others, according to the present invention.

The above disclosure has been made in an effort to fully describe the invention at hand, and should not be seen, construed or interpreted as limiting in any manner whatsoever. As will be evident to those of normal skill in the arts affected by the present invention, other embodiments may be possible that still fall within the scope and spirit of the present invention.

BRIEF DESCRIPTION OF THE DRAWINGS

The invention is further described by way of examples with reference to the accompanying drawings in which.

DESCRIPTION OF PREFERRED EMBODIMENTS

Figure 1:
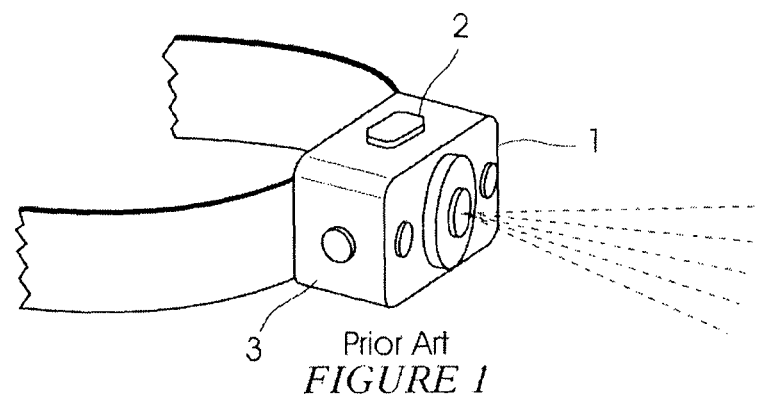
FIG. 1 shows a prior art headlamp incorporating an intelligent switch based on a mechanical pushbutton.
Figure 2:
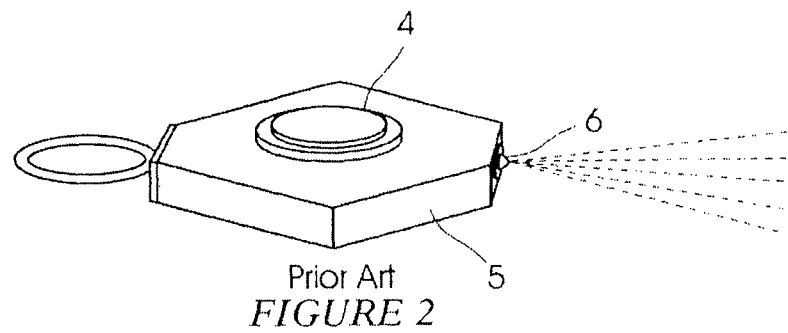
FIG. 2 shows a prior art key-ring light incorporating an intelligent switch based on a mechanical pushbutton.

FIGS. 1 and 2 show a typical headlamp (1) and key-ring switch (5) according to the prior art. As mentioned above, these may typically employ mechanical switches (2) and (4) to facilitate user interfaces, with the stated drawbacks and challenges. It should be noted that prior art mechanical switches may also be prone to inadvertent activations, for instance when the unit is carried in user's trouser pocket, or in a backpack.

Figure 3:
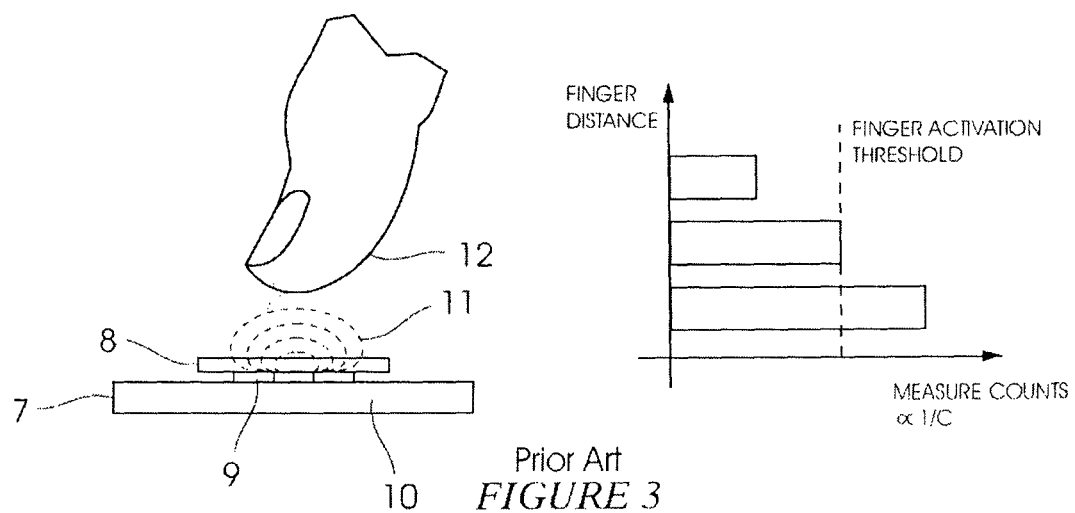
FIG. 3 shows a prior art projected capacitive switch.

FIG. 3 illustrate a typical capacitive switch of the prior art, in this case using projected, or mutual capacitance measurements. If electrode (9) is a transmitter, and electrode (10) is a receiver electrode, both covered by dielectric material (8) and supported by substrate (7), electric field patterns may typically be as illustrated by (11). As the user finger (12) approaches the electrode pair, it should perturb the electric field patterns, resulting in reduced coupling and measured capacitance. This is illustrated by the bar graph of FIG. 3. When using the structure as a switch, a threshold has to be set. If the sensed capacitance falls below the threshold, a touch action may be deemed to have occurred. Even with sophisticated software and signal processing, such switches of the prior art may be prone to inadvertent activation, as it may be difficult for the switch to discern whether it is a user's finger or an illegal object perturbing the field pattern. It is may also be impossible for the switch to discern if the user's finger touched with the purpose of activating the switch, or just in the course of handling the product. Surface capacitive switches of the prior art may suffer from the same drawback.

Figure 4:
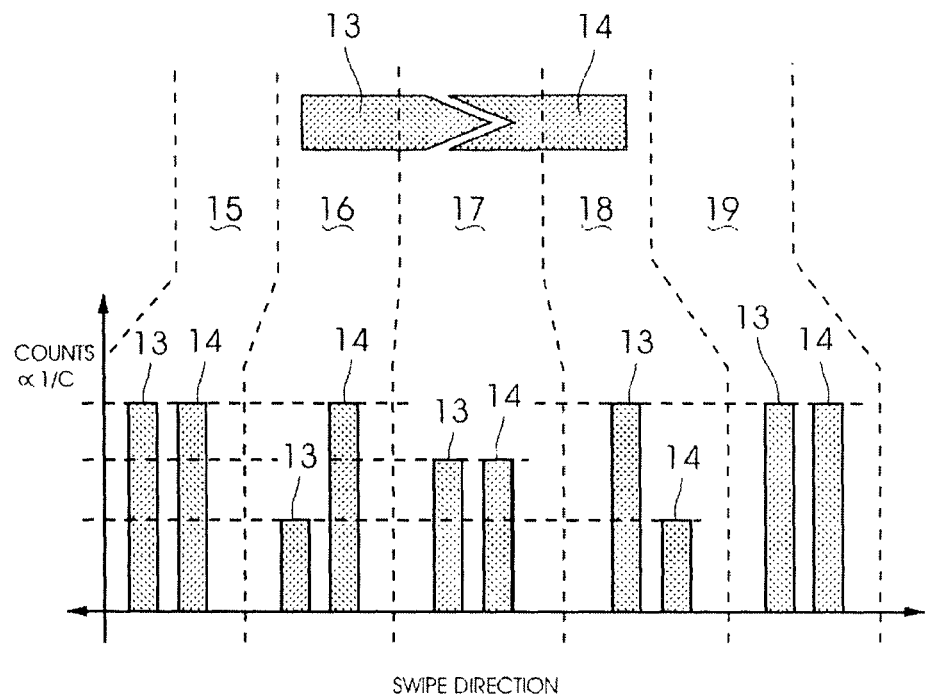
FIG. 4 shows an electrode arrangement and the typical measured capacitance for a two channel surface CSS according to the present invention.

FIG. 4 illustrates the typical electrode arrangement and measured capacitance for a CSS according to the present invention. The illustrated embodiment is for a two channel, surface (or self) capacitance structure using a charge transfer measurement process, as is well known to those skilled in the art of capacitive sensing. This should not serve as limiting, as two channel projected (or mutual) capacitance structures, and other implementations of capacitive measurements (e.g. relaxation oscillators), or other sensing methods may also be used according the present invention. Electrodes (13) and (14) may be juxtaposed on the surface of the hosting device, along a line typically defined by the preferred swiping direction. Electrodes (13) and (14) may, or may not, be covered by a dielectric material. If a user places his/her finger in area (15), central to the line running through both electrodes (13) and (14), the counts for electrodes (13) and electrodes (14) should remain unaltered proximate to the reference value, as illustrated. However, as the user begins a swiping action toward electrode (13), the counts for electrode (13) should start to decrease, with the counts for electrode (14) remaining largely unaltered. If the user finger reaches area (16), the counts for electrode (13) should be at a minimum, and those for electrode (14) should still be more or less unaffected. As the user finger moves towards the center of the CSS structure, the counts for electrode (13) should start to increase again. In conjunction, if the lengthwise spacing between the electrodes is small enough, the counts of electrode (14) may start to decrease. Otherwise, counts for electrode (14) may stay roughly unaltered with reference to the LTA value. With a small enough spacing, the counts for both electrodes (13) and (14) should be at an intermediate level if the user's finger is in area (17), as shown. Continuing the swiping action towards the right, the user's finger will next be across area (18), which should result in counts for electrode (13) to be proximate to the reference value, and that for electrode (14) at a minimum. Once the user's finger reaches area (19), the counts for both electrodes should be proximate to the reference value, and the swiping action is complete.

According to the present invention, a swipe/switch activation event will only be annunciated if the above sequence fulfils specific timing and other criteria. For instance, a minimum period may be set within which the whole sequence must be completed. Or it may be required that the user pause in the center, resulting in intermediate count levels to be detected for a minimum time, followed by a decrease in counts for electrode (14). Or the filtering algorithm may be set-up to two requires two fast swipes to the right, followed by a slow swipe to the left before a swipe/switch activation event will be annunciated. Various other filtering algorithms may be contrived using swipe speed and direction, all covered by the presently disclosed invention.

Figure 5:
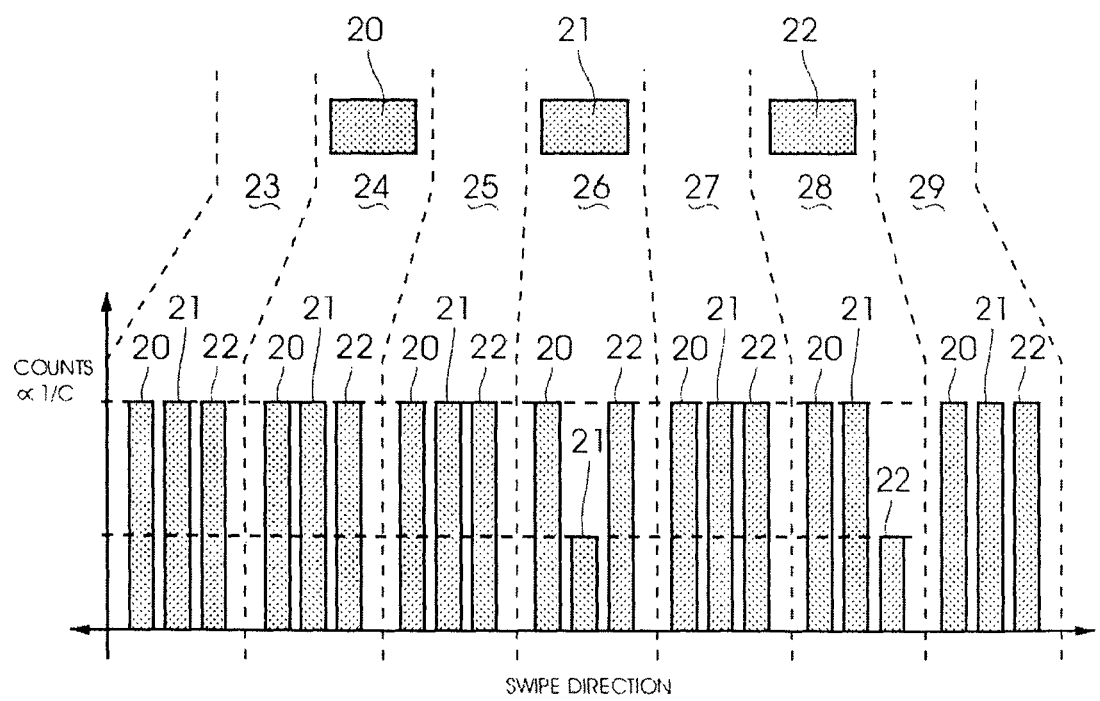
FIG. 5 shows an electrode arrangement and the typical measured capacitance for a three channel surface CSS according to the present invention.

FIG. 5 illustrates the typical electrode arrangement and measured capacitance for a three channel CSS according to the present invention, utilizing surface (or self) capacitance sensing. This embodiment is purely exemplary, and not limiting, as projected (or mutual) capacitance sensing embodiments according to the presently disclosed invention may be possible, as well as embodiments using more than three channels or sensors. The embodiment of FIG. 5 not only differs from that of FIG. 4 in the number of channels, but also in the spacing between electrodes. Electrodes (20), (21) and (22) may be spaced far enough from each other to incorporate "dead zones" between them. If a user finger is in proximity to these zones, the counts for the electrodes may be similar to that measured when no finger is present. Operation of the CSS in FIG. 5 is similar to that described above for FIG. 4, with the difference of the dead zones and the number of channels/sensors. Incorporation of the dead zones may allow a binary representation of the channel status, with a "0" representing a count value below a certain threshold, and proximity of the user's finger, and a "1" representing a count value above an upper threshold, proximate to the reference value, and the absence of the user's finger. In this manner, if a finger swipes from region (23) via regions (24), (25), (26), (27) and (28) to region (29), the resulting data train should be 111, 011, 111, 101, 111, 110 and 111. This may greatly simplify the realization of filtering algorithms in software.

The CSS structures presented in FIGS. 4 and 5, and others according to the presently disclosed invention, may be used to facilitate intelligent user interfaces, and selection of various operating modes, similar to intelligent switches of the prior art. However, one of the benefits of the present invention is that it may offer far more parameters with which to select modes and interface to the user. As mentioned above, the manner in which a swipe event is detected and declared may be made dependent on parameters such as swipe time, pauses, direction and repetition. In addition, one may use a swipe event just to enter a mode selection mode. In this mode, each sensor or channel may be assigned to a specific function or mode. If parameters such as periods between subsequent touches on different channels, or the number of times a specific channel is touched within a specific period are added, it becomes clear that a CSS may potentially be used to realize quite complex programming features, and select between a large number possible modes.

Figure 6:
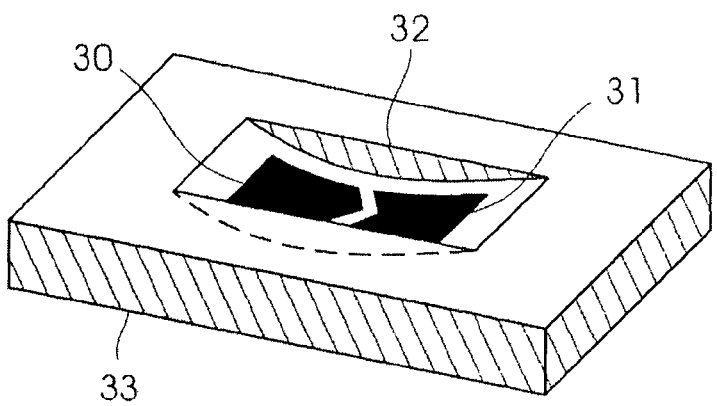
FIG. 6 shows recessed CSS electrode arrangement according to the present invention.

FIG. 6 illustrates a further method according to the present invention which may be used to avoid inadvertent activation. If the CSS electrodes, in this case consisting of surface electrodes (30) and (31), are placed within a recess (32) formed in supporting substrate (33), immunity to inadvertent activation may be increased. To activate the CSS, a dielectric probe not only has to perform a swiping action that satisfy the filtering algorithms employed, but also have to penetrate recess (32) for the duration of the swiping action. It is envisaged, in no limiting fashion, that this might be especially effective in applications such as key-ring lights.

Figure 7:
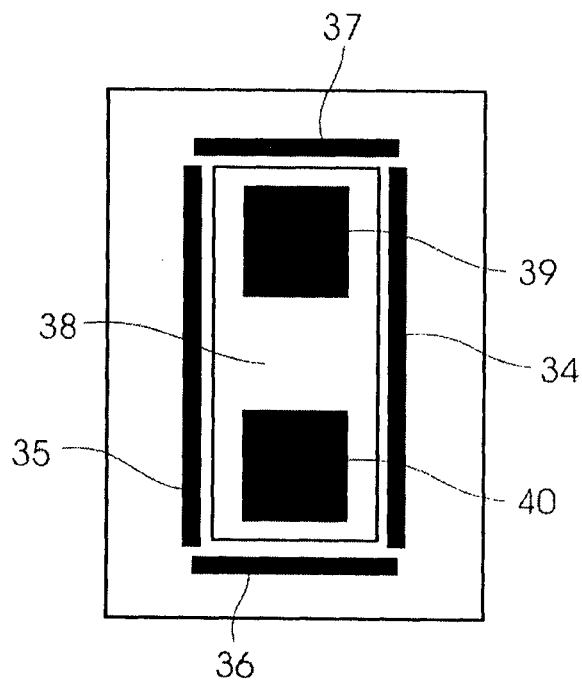
FIG. 7 shows shielding for the electrodes of a CSS according to the present invention.

To further improve immunity to inadvertent activation, the presently disclosed invention teaches that shielding electrodes may be employed, as illustrated in exemplary manner in FIG. 7 for the electrodes of a two channel CSS (38). Shielding electrodes (34), (35), (36) and (37) may, dependent on the shielding requirement, be connected to system ground or to actively driven shield channels, as is known to those skilled in the art of capacitive sensing. If shielding from dielectric objects to the sides of electrodes (39) and (40) is required, only electrodes (34) and (35) may be used. For shielding against dielectric objects present at the lengthwise extremities of the swiping area, electrodes (36) and (37) may be used. If all four shielding electrodes are used, substantial shielding from dielectric objects outside the direct boundary of the CSS may be achieved. Naturally, connection of the shield electrodes to system ground may result in reduced touch sensitivity, as electrodes (39) and (40) may then couple strongly to these electrodes.

Figure 8:
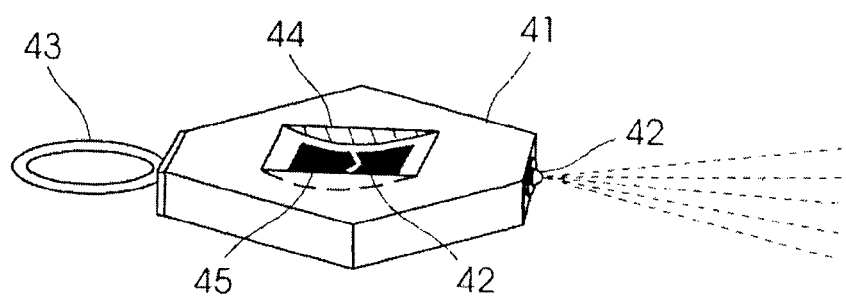
FIG. 8 shows a recessed CSS according to the present invention used in exemplary manner in a key-ring light.

FIG. 8 illustrates incorporation of a CSS according to the presently disclosed invention into a key-ring light (41). By placing two surface capacitance sensing electrodes (45) and

(46) into a recess (44), wide enough to accommodate a user's finger, and using filtering algorithms to detect a swiping action, a CSS may be realized by which the light output of light source (42), typically, but not limited to, an LED, may be controlled. Such an implementation may facilitate lower cost, better waterproofing, more durability and a smaller chance for inadvertent activation, as noted previously in this disclosure. In one embodiment, the user may use a swiping action from electrode (45) to electrode (46), or vice versa, to switch the light output from zero to maximum, or vice versa. Or a number of swipes may be used to select between various light output levels, or pulsed light options. Another embodiment may use a single swipe action to change the key-ring light mode from non-responsive to a mode where a touch on either electrode (45) or (46) can select between various light output levels and sequences. The embodiment illustrated by FIG. 8 should serve purely as an example embodiment, and is by no means limiting. For instance, projective capacitance sensing technology may be used, or three or more channels, or shielding electrodes etc.

Figure 9:
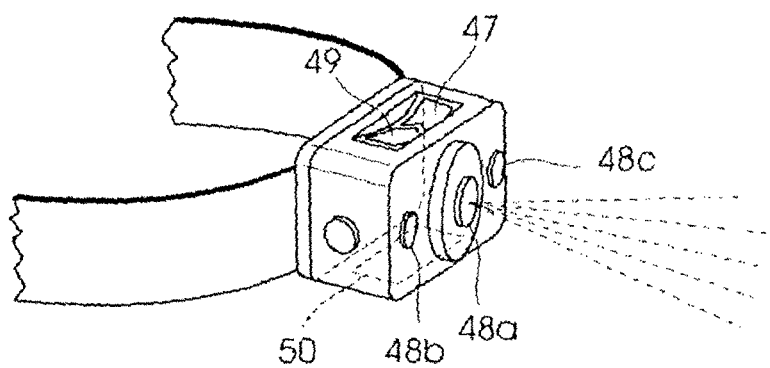
FIG. 9 shows a CSS with a blocking channel, according to the present invention, used in exemplary manner in a headlamp, as well as the typical use of shielding electrodes. It also illustrates dual loads that may be controlled with one CSS.

An embodiment of the present invention in a headlamp is illustrated by FIG. 9 in an exemplary manner. The output of light source (48a), typically, but not limited to, an LED, may be controlled by CSS (49), in this case a three channel, surface capacitance sensing unit. Shielding electrodes (47) may assist to decrease the chances of inadvertent activation of the CSS. To allow the user to grip the headlamp between thumb and forefinger without accidental or inadvertent switching, a blocking channel and electrode (50) may be provided. If a touch is sensed on blocking electrode (50), the CSS may enter a non-responsive mode which may last until the touch on blocking electrode (50) is removed. This may allow the user to grip the headlamp and adjust the light beam angle by tilting the unit up or down, for example. Another embodiment may be to use the blocking electrode (50) not only to block out touches, but to select between various modes, if preceded by a swipe action on CSS (49) within a specific maximum period. The embodiment illustrated by FIG. 9 is once again purely exemplary, and not limiting, with various other headlamp embodiments that fall under the teachings of the presently disclosed invention possible.

For the exemplary embodiment presented in FIG. 9, the present invention further teaches that multiple light sources, for instance (48a), (48b) and (48c) may be controlled with a single CSS (49). For example, to control the main light source (48a) from an off-state, the user may execute a swipe gesture from right to left (RTL) on CSS (49), followed by any number of swipe gestures RTL or left to right (LTR), or specific touch gestures on the various electrodes of the CSS within a predetermined period, depending on the setup of the device. Conversely, to control the secondary light sources (48b) and (48c) from an off-state, the user may execute a swipe gesture from LTR, followed by any number of LTR or RTL swipe gestures, or touches on the electrodes of CSS (49) within a pre-determined period. Naturally, the above disclosure is purely exemplary, and should not be seen as limiting, as a large number of swipe gesture and touch combinations may be used in conjunction with timing constraints to control multiple light sources. It also stands to reason that the use of one CSS to control multiple loads as disclosed is not just limited to lighting loads, but may be applied to the control of a large number of electrical loads, for example audio and visual loads, electrical machine control, heating and cooling control etc.

Figure 10:
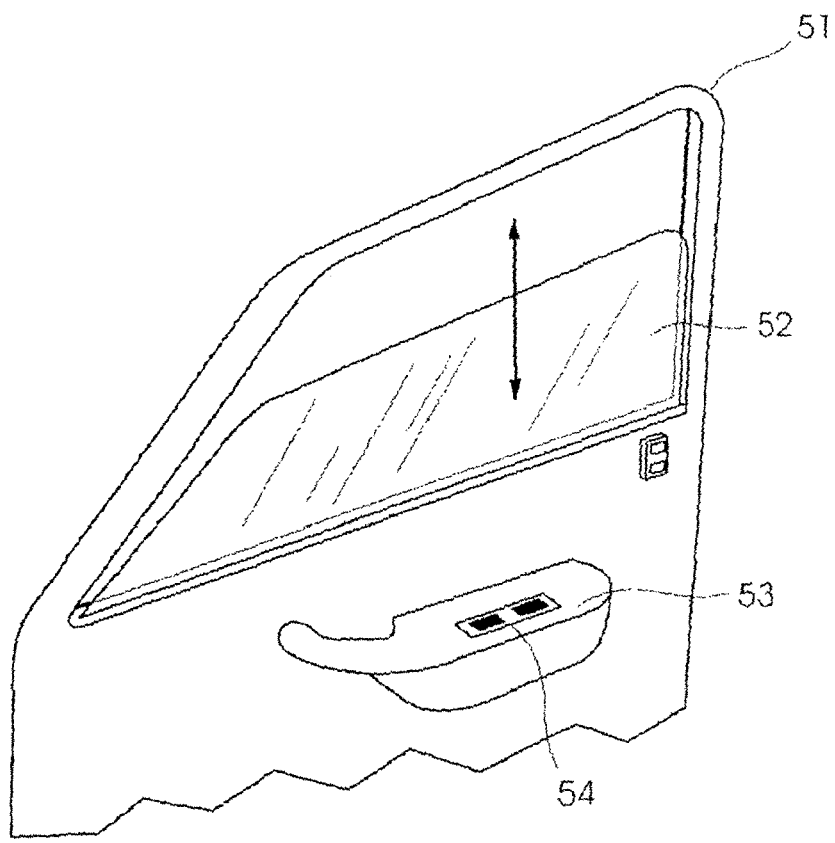
FIG. 10 shows a recessed CSS according to the present invention used in exemplary manner to control window height in an automobile.

FIG. 10 depicts an embodiment of the present invention in the control module for a vehicle's electric windows. Typically, the controls to lower/raise the window (52) of a vehicle door (51) down/up may be contained within the arm rest (53) of said door. As such, the driver or passenger arm or hand may be prone to often make physical contact with the controls. If capacitive sensors held by the prior art are used as user interface for the controls, the chances of inadvertent activation may therefore be quite high. However, a recessed CSS (54) as illustrated may reduce this risk significantly. To lower/raise the window, a user needs to place his/her finger within the recess of CSS (54), and perform a swiping action. This may start the window movement. To further control or stop window movement, a large number of actions may be performed that fall within the present invention. For example, the user may perform a second swiping action, or use individual touches, or pause in the process of making a swipe etc. All of these are exemplary. It may be possible to realize other embodiments of CSS based vehicle electric window control according the teachings of the presently disclosed invention.

Figure 11:
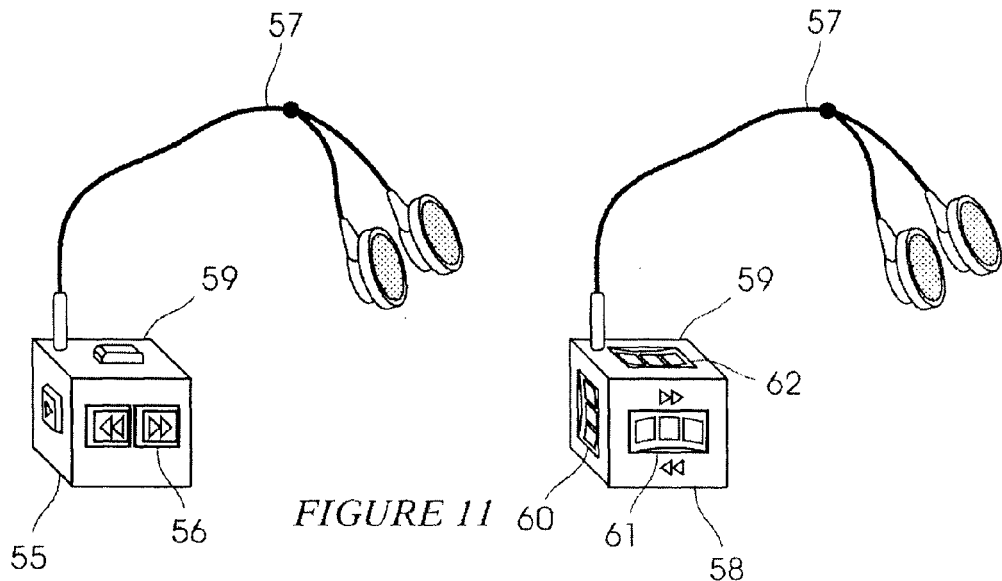
FIG. 11 shows a prior art low cost digital music player that uses mechanical buttons, and a digital music player incorporating Capacitive Swipe Switches according to the present invention.

Yet another embodiment of the present invention is shown by FIG. 11. The present state of the art holds low cost digital music players similar to (55) shown on the left of FIG. 11. Typically, these may employ traditional mechanical buttons (56), or prior art touch switches, with all the drawbacks set out in the previous discourse. A USB or other type of connector (59) may typically be provided to load digital music data onto the player. Audio output may be provided at a jack, typically for connection to earphones (57). The right hand side of FIG. 11 shows an embodiment of the present invention into such a low cost digital music player, with the traditional buttons replaced by CSS's (60), (61) and (62). For fast forward or rewinding operations, the swipe direction may suffice to start the operation, with a tap halting it. A further tap may result in reverting to the prior action (fast forward/rewind) or another action. Two taps in quick succession during a fast forward or rewind operation may be used to increase the speed or tempo.

Figure 12:
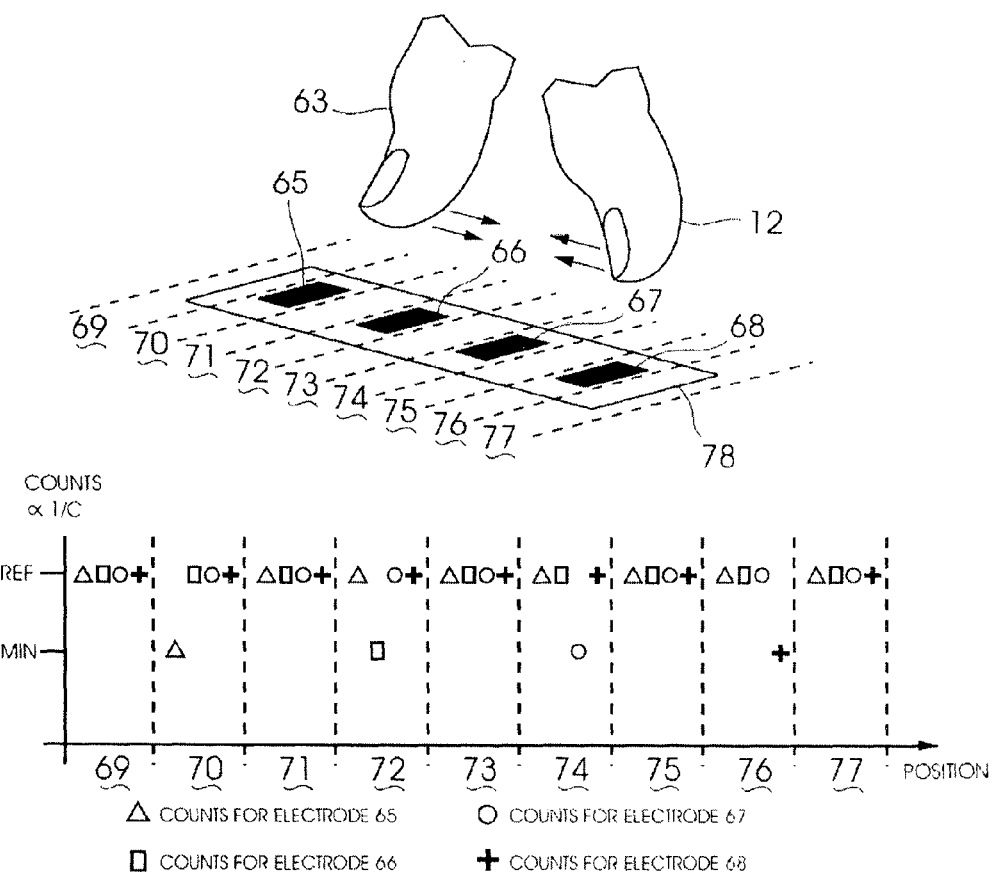
FIG. 12 shows the electrode arrangement and typical measured capacitance for a CSS that tests for simultaneous swipe actions in opposing directions to reduce the chance of inadvertent activation.

FIG. 12 shows another CSS embodiment of the present invention which may be used to further improve immunity against inadvertent activations. The embodiment illustrated uses four surface capacitance sensors or channels. To declare a switch activation, the embodiment requires that simultaneous swipes be made by two fingers, in opposing directions. This may be achieved by, for example, a pinching movement. For instance, if a user places his/her middle finger (63) at position (69), and his/her forefinger (64) at position (77), the counts for all four sensors would typically be at the reference or LTA value. By moving his/her fingers towards each other, the counts for electrodes (65) and (68) should decrease to a minimum value, with counts for electrodes (66) and (67) staying at the reference value. Next, the counts for electrodes (65) and (68) should simultaneously return to the reference value, accompanied by a simultaneous decrease in the counts for electrodes (66) and (67). Lastly, counts for electrodes (66) and (67) should return simultaneously to the reference, resulting in counts for all four electrodes being at this value. By testing for the above within certain timing constraints, the CSS may declare a switch activation event. The increased immunity of this embodiment to inadvertent activation may be based on the fact that the chance of two illegal/unintentional dielectric probes or other material performing swipe actions simultaneously in opposing directions is low. One could envisage that an illegal/unintentional unidirectional swipe action by for instance objects packed with a product into a backpack, and which satisfy timing constraints, may occur. But having opposing illegal/unintentional swipes that satisfy the required timing constraints should be highly unlikely. An embodiment as in FIG. 12 may be applied to, but definitely not limited to, products like headlamps, handheld torches, electric window controls, electrical tooth brushes, electric shavers and all manner of critical switches which, for safety or energy conservation reasons, cannot afford inadvertent activation.

Figure 13:
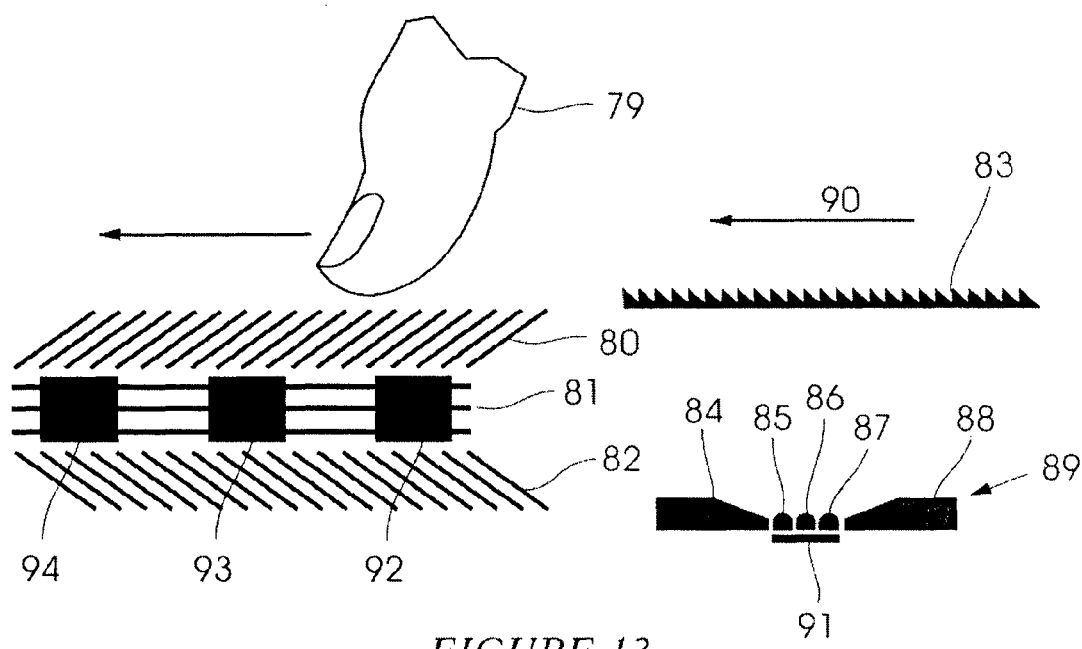
FIG. 13 shows exemplary dielectric surface pattern details, to guide the user of the CSS, according to the present invention.

FIG. 13 illustrates an exemplary embodiment of the present invention which comprises the possible use of a specific dielectric surface pattern to guide a user during operation of a three channel surface capacitance swipe switch. Electrodes (92) to (94) are typically covered by a dielectric material, which provide isolation to the user's finger. Ridges are formed in said dielectric material above electrodes (92) to (94), with the ridges running in parallel to the required swiping direction. Frontal view (89) show these ridges as (85), (86) and (87) above electrode (91). The top ends of ridges (85), (86) and (87) may or may not be rounded. Alongside said parallel ridges may be a plurality, which may be a large number, of diagonally opposed ridges, as illustrated by (80), (82), (84) and (88). Said diagonal ridges may have sides which are slanted when approached in the required swiping direction (90), but essentially vertical or overhanging in the reverse direction, illustrated at (83). To further assist the user during location of the center of the CSS, in a width sense, the top sides of the diagonal ridges may slope towards the center, as illustrated by (84) and (88). When a user's finger (79) approaches the CSS illustrated from point (81), the illustrated pattern should intuitively guide it towards the width wise center of the CSS and to the parallel ridges and electrodes, in part due to the sloping top sides of the diagonal ridges. Due to the angle of the diagonal ridges, and their slanting sides in only one direction, an attempt to swipe the CSS in a reverse direction of that required should result in the user experiencing tactile impediment. The illustration in FIG. 13 is purely exemplary, and should not construed to be limiting. For instance, the dielectric surface pattern illustrated in FIG. 13 may also be used with a projected capacitance swipe switch, according the presently disclosed invention, or changes may be made to the pattern, or more or less sensing channels may be used without departing from the scope of the present disclosure.

Figure 14:
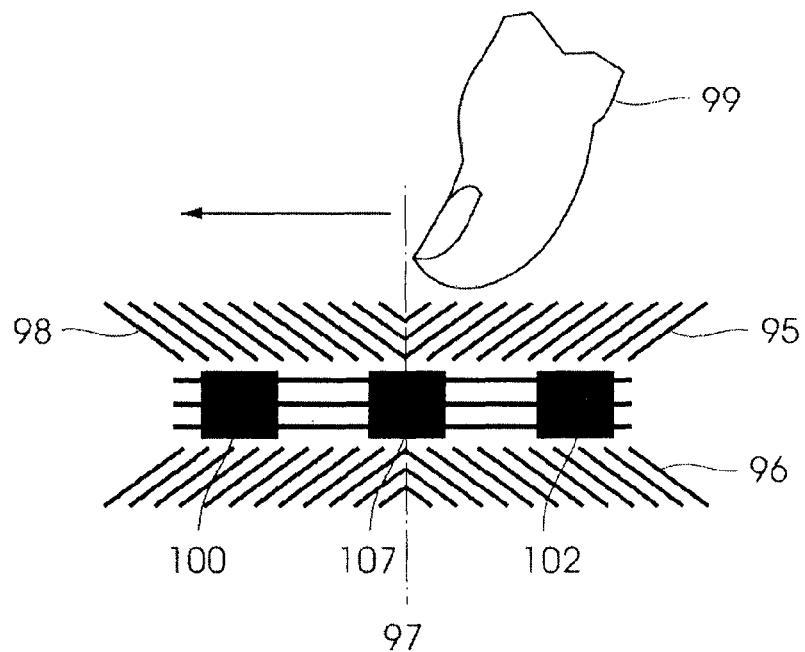
FIG. 14 shows another exemplary dielectric surface pattern according to the present invention, which may be used to guide a CSS user, with an angle reversal for the diagonal ridges at the lengthwise center point, indicating relative finger position to the user.

It is foreseeable that a user may need to locate the length wise center, or another point or electrode of the CSS, without having visual feedback. For instance, if a swiping action is used in headlamp to activate a function selection mode, and touches on specific electrodes of the CSS select the various functions, the user may require to know exactly where his/her finger is. In headlamps held by the prior art, the raised and distinctive nature of the employed mechanical switches provided sufficient tactile feedback to allow exact location. However, if a CSS is employed with a smooth dielectric material between user finger and electrode, such exact location may be difficult. FIG. 14 discloses in an exemplary manner how this need may be addressed. By changing the angle of diagonal ridges, as illustrated by (95) and (98), abruptly at a certain point along the length of the CSS, for instance at (97) in FIG. 14, the user may sense the exact position of his/her finger (99) via tactile feedback. In the example of FIG. 14, the user may be able to determine the location of electrode (101) fairly accurately without visual feedback.

Figure 15:
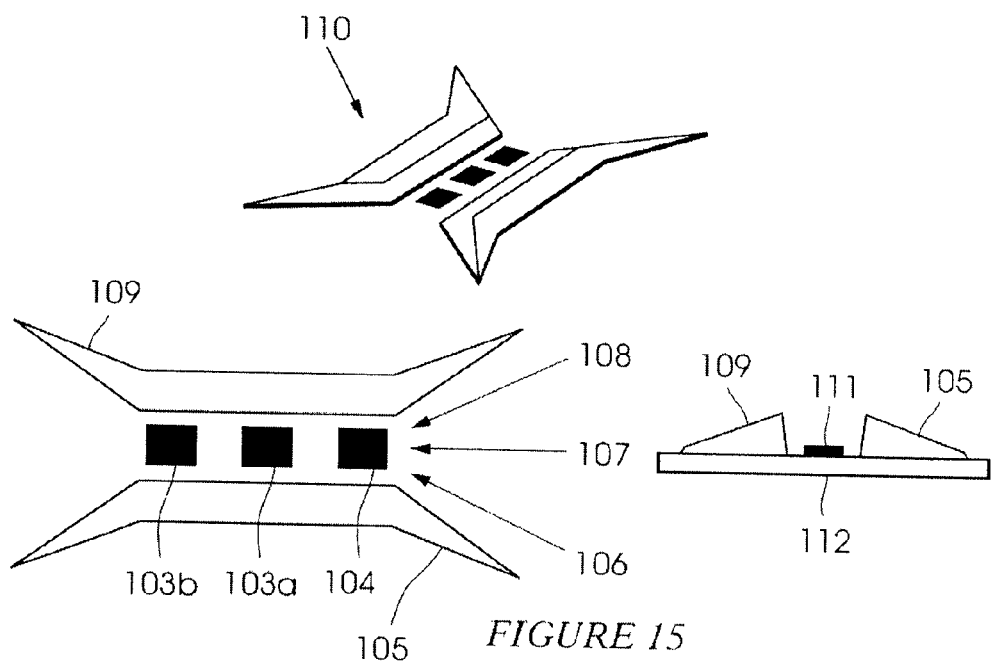
FIG. 15 shows the use of elevated ridges which flare in a funneling manner to guide users towards the CSS, and the correct swiping location, according to the present invention.

FIG. 15 shows another exemplary embodiment of the present invention which utilize elevated ridges to guide a user towards the CSS. Ridges (105) and (109) lie primarily parallel to the electrodes of the CSS, and the required swiping direction (107). However, they may also flare in a funnel like manner at their two ends, as illustrated in exemplary manner. This should allow fingers or probes moving along diagonal lines (108) or (106), for instance, to find the required swiping direction (107) and the start of the CSS with fair ease, and without visual feedback, as illustrated in exemplary manner at (110). Further, according the presently disclosed invention, it is also envisaged that the inner and outer edges of elevated ridges (105) and (109) may slope at dissimilar angles. As illustrated, the inner edge of the ridges may drop abruptly towards the electrodes, such as (111), but the outer edges may slope gently towards supporting substrate (112). This should further facilitate the location and use of the CSS without visual feedback.

Figure 16:
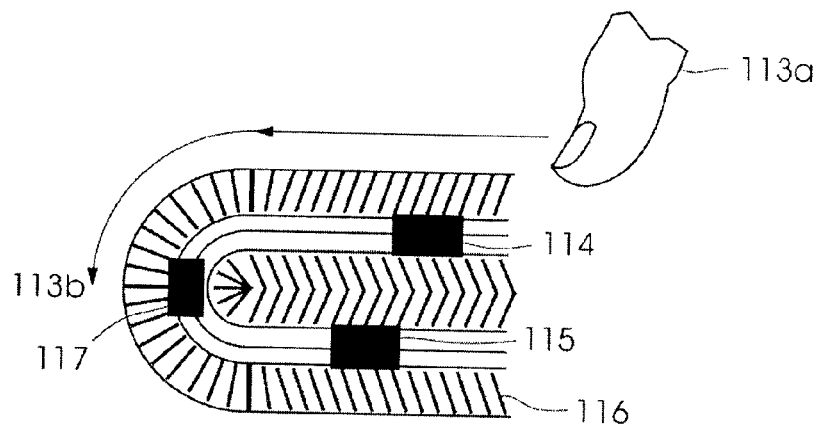
FIG. 16 shows how surface dielectric patterns may be used according to the present invention to guide a user of a CSS which have a 180 degree direction reversal, for increased immunity to inadvertent activation.

FIG. 16 shows an embodiment of the present invention which should increase immunity to inadvertent activation substantially. Ridges which are respectively parallel and diagonal to the required swiping direction, as disclosed in the preceding discourse, may be used with the addition of a full or partial reversal in the required swiping direction. FIG. 16 illustrates such an arrangement, using a three channel surface capacitance CSS, in an exemplary manner. Typically, a user's finger (113a), or other probe, may start proximate to electrode, (114). Due to the haptic feedback provided, it should be guided along direction (113b) past electrodes (117) and (115), without the requirement for visual feedback. The likelihood of such a direction reversal occurring naturally, due to illegal probes or dielectric material touching the CSS, within the timing constraints of the CSS, should be quite small, possibly increasing immunity to inadvertent activation or operation of the CSS substantially.

Figure 17:
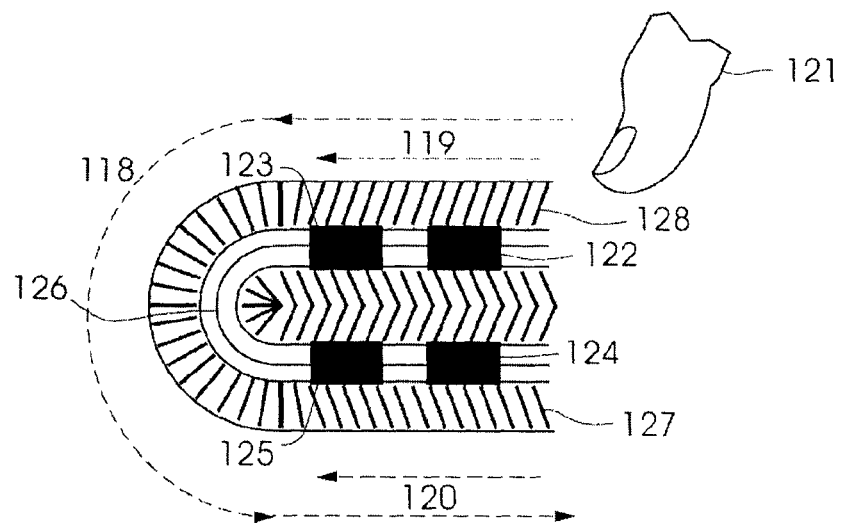
FIG. 17 shows the exemplary use of a four channel surface capacitance CSS with dielectric surface patterns to guide a user along a reversal in required swiping direction, and the realization of two independent two channel CSS units, according to the present invention.

FIG. 17 illustrates an exemplary embodiment that utilizes four surface capacitance electrodes to realize two secondary two channel CSS units within a primary four channel CSS unit, all contained within a surface ridge guided swipe path that includes a reversal in required direction. Electrodes (122), (123), (124) and (125) form the primary CSS unit, containing first and second secondary CSS units, formed by electrode pair (122) and (123) and pair (124) and (125) respectively. Surface ridges, typically shown by (127) and (128), guide the engaging probe, which may be a user's finger, as illustrated by (121), along the required swiping direction. An exemplary operation may be as follows. The unit is enabled or unlocked by a complete swipe along path (118), starting at electrode (122) and ending at electrode (124) or vice versa. Once enabled, the user may swipe his/her fingers along either path (119) or path (120), or make specific touches, to operate or control associated circuitry. Due to ridges in the surface of the dielectric material that cover the electrodes, some of which is shown by (128) and (127), a user should be able to locate and follow paths (118), (119) and (120) without visual feedback. To disable or lock the two secondary CSS units, a user may perform another complete swiping action along path (118) of the primary CSS unit, after which the CSS secondary units may be ignorant to any actions performed on them exclusively. It is envisaged that an embodiment such as that disclosed by FIG. 17 may be applied to control automotive vehicle window height, where a user unlocks the window control by swiping along path (118), and lowers or raise the window through shorter swipes along paths (119) or (120) respectively. The present invention is not limited to the above exemplary embodiment, with embodiments that use projective capacitance or other sensing technologies along with the principle disclosed by FIG. 17 possible according the teachings of the present invention.

Figure 18:
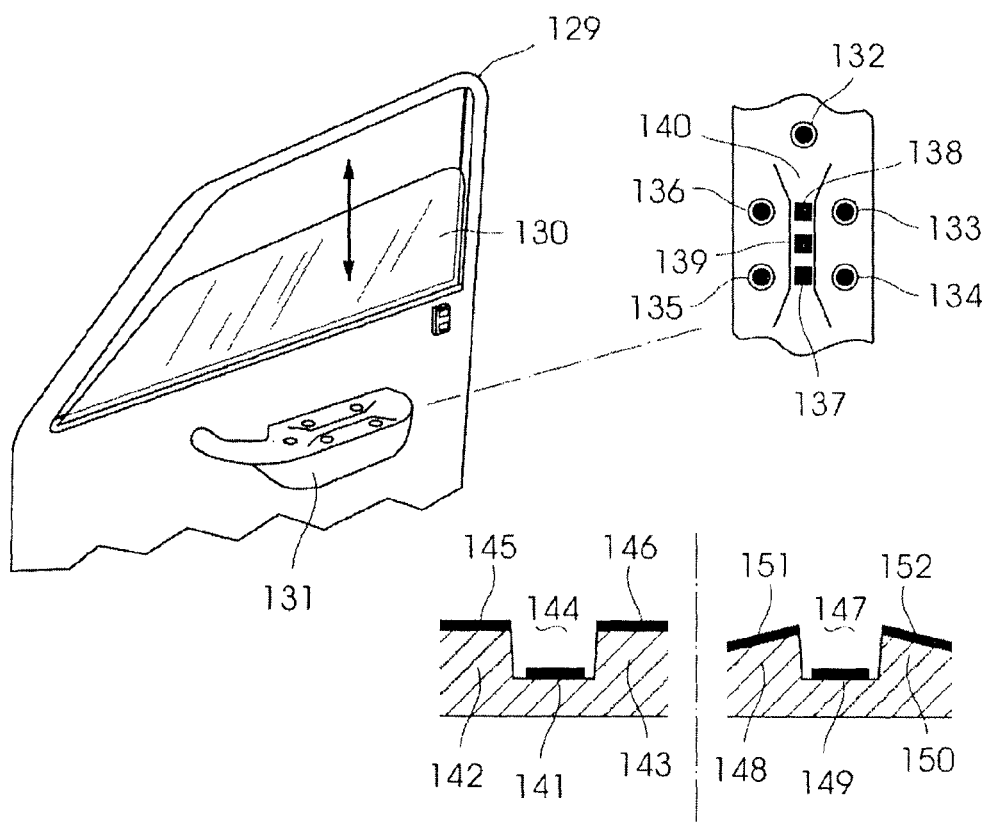
FIG. 18 shows the exemplary use of a recessed CSS and five touch switches to control a vehicle's window position, according to the present invention.

FIG. 18 illustrates yet another exemplary embodiment of the present invention that may be used to control automotive vehicle window height. Arm rest (131) may be that of the driver, and will typically contain controls for all four windows of the vehicle. If a recessed CSS, similar to that disclosed during earlier discourse, and illustrated in exemplary manner by surface capacitance electrodes (137), (138) and (139) and recess (140), is placed along with five, recessed, single channel surface capacitance switches (132), (133), (134), (135) and (136) into arm rest (131), a cost-effective and durable window height control interface may be realized. The invention is not limited to surface capacitance sensing in this regard, and include the possible use of projected or other capacitance sensing methods.

Exemplary implementations of said single channel, recessed touch switches are illustrated at (144) and (147). In the example presented at (144), sensing electrode (141) is contained within a recess in the surface of material (143), with recess sidewalls, as illustrated by (142), angling sharply upwards. Shields (145) and (146) are actively driven, as is known in the art of capacitive sensing, to ensure that electrode (141) is shielded from engaging material or probes on the surface of material (143). It is also possible to not use active shield technology, but merely ground material (145) and (146) by connection to system ground, and achieve sufficient shielding. Another example of a possible implementation of said recessed, single channel touch switches are illustrated at (147), where the surface of material (148) gradually slopes upward towards the lip of the recess, with sidewalls, as illustrated by (150), forming a sharply opposing angle, and sensing electrode (149) contained within the recess. Actively driven shields (151) and (152) are again used to protect electrode (149). These may again be material that is only grounded and do not use active shield technology, as discussed above.

Operation of the embodiment disclosed by FIG. 18 may be as follows, presented in an exemplary manner, without the imposition of a limit. To control a specific window's height, the user may activate one of the respective single channel switches (133), (134), (135) or (136) by inserting his/her finger into the recess, and pressing down. This will typically need to be followed by a swiping action within recess (140) along CSS electrodes (137), (139) and (138) within a specific period, with the swiping direction determining whether the window will be raised or lowered. A number of possible actions to control window position and motion may be possible. For example, the user may follow a first swiping action by a dedicated touch to a demarcated area above either electrodes (137), (139) or (138), with a touch to each area resulting in different window operating functions, for example, but not limited to, a fast raise event, a fast lower event or a mid-point stop event. Alternatively, the user may use a touch on one of the respective single channel, recessed switches (133), (134), (135) and (136) to select a particular window, perform a swiping action along the recessed CSS to start the process of raising or lowering the window, and a second touch on the specific single channel, recessed switch to halt window motion at a desired point. Many other combinations to control window motion and position using the disclosed combination of single channel, recessed touch switches and a shared, recessed CSS is possible according the present invention. A fifth single channel, recessed touch switch, such as illustrated in exemplary manner at (132), may be used to lock all windows, or perform a similar action simultaneously on all windows. Visible feedback may be provided to the user, in the arm rest or at another location, to indicate the status of the window control interface contained within arm rest (131), according the present invention.

Figure 19:
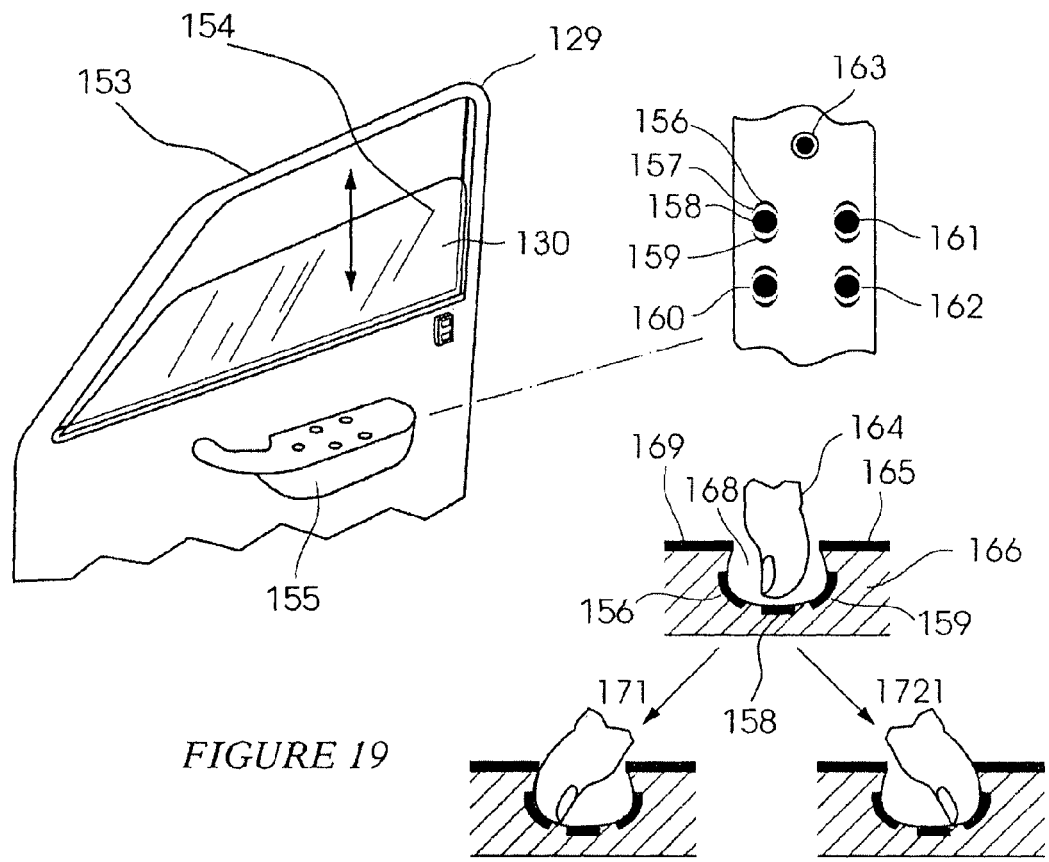
FIG. 19 shows the exemplary use of active driven shields and overhanging material to realize intelligent capacitive sensing based electronic switches with blocking electrodes for control of a vehicle's window position, according to the present invention.

FIG. 19 illustrates another exemplary embodiment of the present invention for a possible interface to control automotive vehicle window position and motion. In this case, a simplified approach is used, without use of a CSS, to provide a control interface for all the windows of a vehicle, typically contained within the driver side arm rest, illustrated by (155). Four recessed touch switches (157), (160), (161) and (162) may be provided in said arm rest. Each touch switch may utilize two capacitive sensing electrodes, as illustrated in exemplary manner by (156) and (159), a specifically shaped recess, as illustrated in exemplary manner by (168), and a blocking electrode, as illustrated in exemplary manner by (158). The upper surface of arm rest (155) that normally comes into contact with the drivers arm, hand or fingers may be partially or fully covered by conductive material, illustrated by (165) and (169), which may be connected to actively driven shield circuitry, or to system ground. In the example presented, electrodes (156), (159) are surface capacitance sensing electrodes. Naturally, the disclosed invention is not limited to surface capacitance sensing technology in this regard, and includes use of projected or mutual capacitance or other capacitance sensing technologies.

Exemplary operation of the embodiment disclosed by FIG. 19 may be described as follows, without limiting effect. To operate a particular window, a user may simply insert his/her finger (164) vertically into the respective recess, as illustrated, resulting in blocking electrode (158) being engaged. If blocking electrode (158) is sufficiently engaged by finger (164), any activation of the circuitry that controls the position of window (154) may be inhibited. Further, due to the recess shape and the possible use of actively driven shields or grounded material, illustrated by (165) and (169), electrodes (156) and (159) should not be sufficiently engaged by finger (164) in a vertical orientation to cause a threshold crossing capacitance change. The recess shapes used in the disclosed exemplary embodiment are such that the sensing electrodes may be covered partially or fully by an overhanging lip, which may or may not have an active shield or grounded material on it. The presence of active shields or grounded material close to the user's finger, when placed vertically into the recess, may reduce sensitivity to said finger. And the location of the electrodes under the lip should ensure that said electrodes are a sufficient distance away from the engaging vertical finger. To activate the circuitry that controls window position, the user may simply angle his/her finger forward or backwards, and press against the area underneath which the respective electrode is situated. This results in said finger moving away from said blocking electrode, and if said recess is properly designed, said blocking electrode should not be sufficiently engaged by said finger anymore, with the blocking function subsequently terminated, and activation of the circuitry which controls window motion allowed. For instance, to raise a window, the user may angle his/her finger forward, and press, as illustrated at (171). Conversely, to lower a window, the user may angle his/her finger backwards, and press, as illustrated at (172). It is evident from the example presented by FIG. 19 that finger (164) does not engage blocking electrode (158) in a substantial manner when angled forwards or backwards as illustrated at (171) and (172) respectively. Once again, a large number of mode or function selections are possible. For example, two brief taps on the forward electrode (171) may result in an auto-raise event, halted by a third tap on electrode (171). According the present invention, visual indication may be given to the user when proximity of a probe is detected by either of the two capacitance sensing channels of the recessed switch. In this manner, accidental activation may be further prevented.

As with the exemplary embodiment disclosed by FIG. 18, the embodiment in FIG. 19 may incorporate the use of a fifth, or more, single channel, recessed touch switch (163). This may be used to lock all the other touch switches in the interface, or to select specific modes or functions. Visual feedback corresponding to the operation of switch (163), and the state of the control interface may be provided to the user. Due to the capacitive technology employed, a window control interface as presented in FIG. 19 may offer improved reliability, due to the absence of moving parts, and may be low cost, with high immunity to inadvertent activation. It also presents an interface which is close in operation to some prior art mechanical switch implementations, which should assist with user acceptance.

Figure 20:
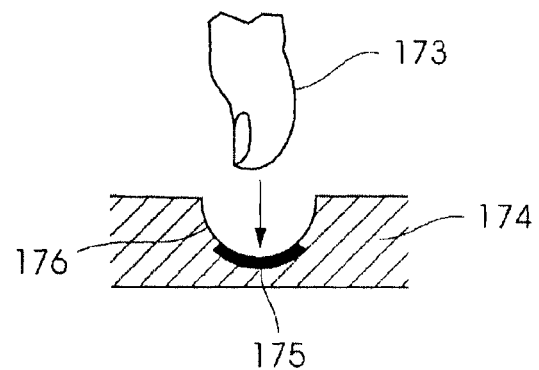
FIG. 20 shows an exemplary electronic switch according to the present invention that utilize a single channel capacitive sensor within a simple recess to improve immunity against inadvertent activation.

FIG. 20 presents an exemplary embodiment of the present invention that comprises use of a single channel surface capacitance sensor to realize an electronic switch for a product that may have high immunity to inadvertent activation. Surface capacitance electrode (175) is contained by recess (176), formed into supporting material (174), and typically placed at the bottom of the recess. To operate said switch, the user must insert the engaging probe, which may be his/her finger (173), or another member, into recess (176), and make physical contact with the, for example, dielectric material covering electrode (175), or be in close proximity. This should result in sufficient change in the measured capacitance, or another parameter, to declare an activation/operation event, and change the state of said electronic switch accordingly. Due to the recess, and a dedicated probe insertion action required from the user, an embodiment such as that presented in FIG. 20 may exhibit high immunity to inadvertent activation. To further reduce the risk of inadvertent activation, use may be made of actively driven shield or grounded conductive material on the surface of supporting material (174). The embodiment disclosed in FIG. 20 is purely exemplary, and other capacitive sensing technologies, for example projected or relaxation oscillator based capacitance sensing, or other sensing technologies may be used without departing from the spirit and scope of the presently disclosed invention.

Figure 21:
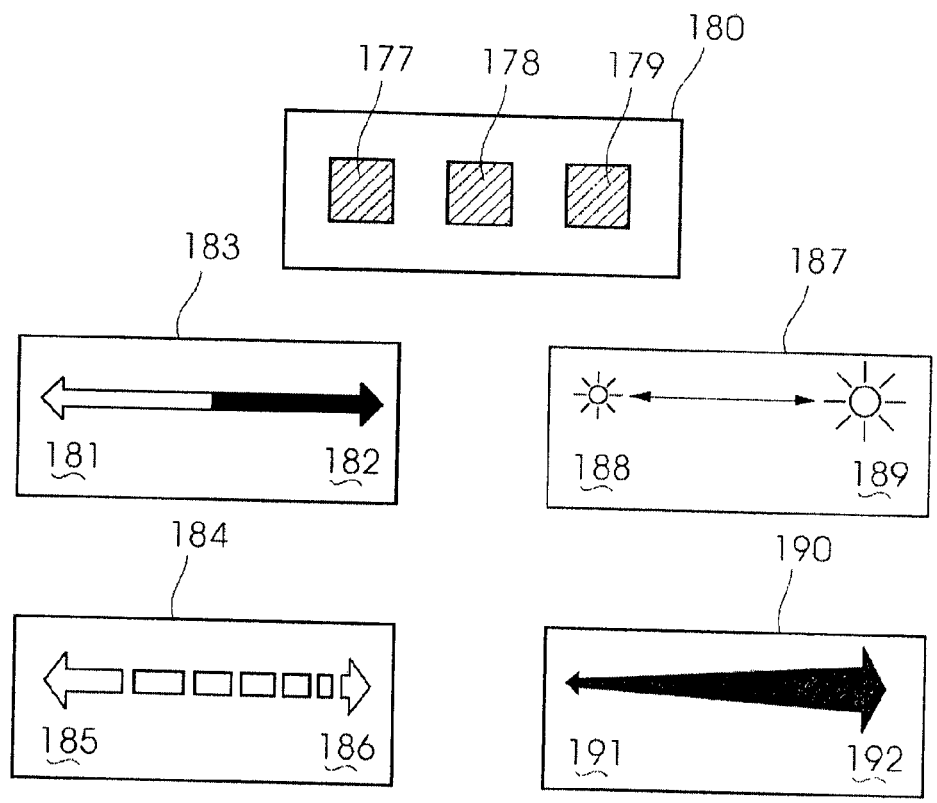
FIG. 21 shows an exemplary CSS according to the present invention along with various functionality indications which may be used on the body of products, or elsewhere, to clarify use.

FIG. 21 illustrates a number of swipe switch functionality indications that may be used on the body or housing of a product, or elsewhere, to clarify use of said swipe switch, according the present invention. CSS (180) makes use of three electrodes (177), (178) and (179). The number of electrodes used to form the CSS need not be constrained to two, but may be any number, with a minimum of two electrodes. As disclosed previously, a number of functions may be realized with a CSS according the present invention, dependent on the direction of the initial swipe gesture. For example, if a single CSS is used to control two light sources, one white, and one color, a swipe from electrode (179) to electrode (177), in other words RTL, may be used to control the white light source, as shown at (181) of indication (183). Conversely, a swipe from (177) to (179), or LTR, may be used to control the color light source, as shown at (182) of indication (183). Alternatively, CSS (180) may be used to control the intensity of a single light source. An indication as illustrated at (187) may be used to clarify CSS functionality for a user, where a swipe RTL will result in less intensity, shown by (188) and a swipe LTR will result in increased light intensity, shown by (189). Or an indication as shown at (184) may be used to clarify functionality if CSS (180) is used to control the flashing period of a light source. In this embodiment, a swipe from electrode (177) to (179) via electrode (178), or LTR, will result in shorter flashes, as indicated at (186), and a swipe from RTL will result in longer flashes, as shown at (185). If a CSS of the present invention is used to control a load other than a lighting load, an indication such as shown by (190) may be used to clarify functionality for a user. A swipe from LTR will result in more electrical energy being transferred to the load, as indicated at (192), and a swipe RTL will result in less electrical energy being transferred to the load, as shown at (191).

Figure 22:
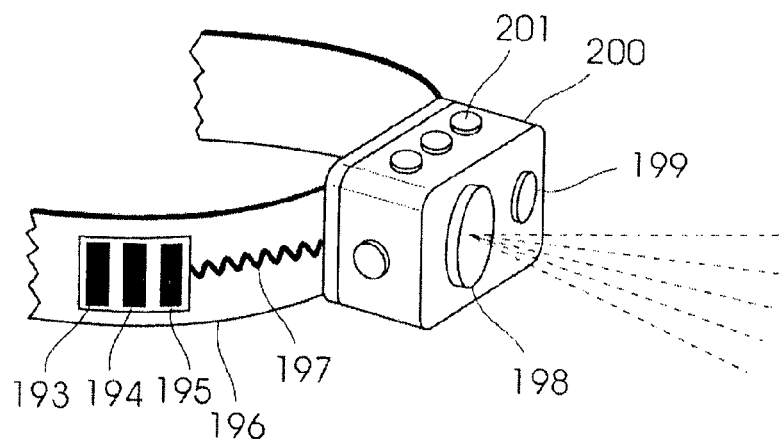
FIG. 22 shows an exemplary embodiment of the present invention in a head lamp, where the CSS is placed in the elastic headband, as well as the use of dual loads and BPM indicators.

In FIG. 22, the exemplary placement of a CSS in the elastic headband (196) of a headlamp (200) according to the present invention is shown. Said CSS may consist of electrodes (193), (194) and (195), and may make use of flexible interconnect (197) to the body of the headlamp. The circuitry required to monitor said electrodes, and annunciate swipe, touch or proximity events may be contained within the body of the headlamp, or may be located near the electrodes in the headband. The latter embodiment may be beneficial, as it implies that interconnect (197) will only be used for digital communication, and not for capacitive sensing, and as such, will not be influenced by the users hand. The illustration is purely exemplary, and any number of electrodes and configurations may be used to implement the CSS, without departing from the scope and spirit of the presently disclosed invention.

FIG. 22 further illustrates the possibility to control multiple light sources, as taught by the present invention. Headlamp (200) contains a primary light source (198), for example with high brightness, used as a spotlight, and a secondary light source (199), for example of lower intensity, with a wider illumination angle. In addition, a number of color LED's, as illustrated by (201), may be contained within the body of the headlamp, and used to facilitate a BPM function. According the presently disclosed invention, and in an exemplary embodiment, if all the light sources are in an off-state, and the user swipes from electrode (193) to electrode (195) via electrode (194), or LTR, control of primary light source (198) with swipe gestures in any direction or touches on specific electrodes within a pre-determined period may be facilitated. Conversely, if all light sources are in an off-state, and the user swipes from RTL, control of secondary light source (199) with swipe gestures or touches on specific electrodes within a pre-determined period may be facilitated. Indicators (201) may be used to implement a BPM function, according the present invention. For example, if all light sources are in an off-state, the user may determine battery state by making a prolonged touch on a specific electrode of the CSS, followed by a specific swipe gesture on the CSS. It will be apparent to those of skilled in the arts of capacitive sensing and portable lighting products that a large number of control functions may be realized according the present invention using a CSS, swipe direction and duration, number of touches and their duration, proximity detection events and combinations thereof.

Figure 23:
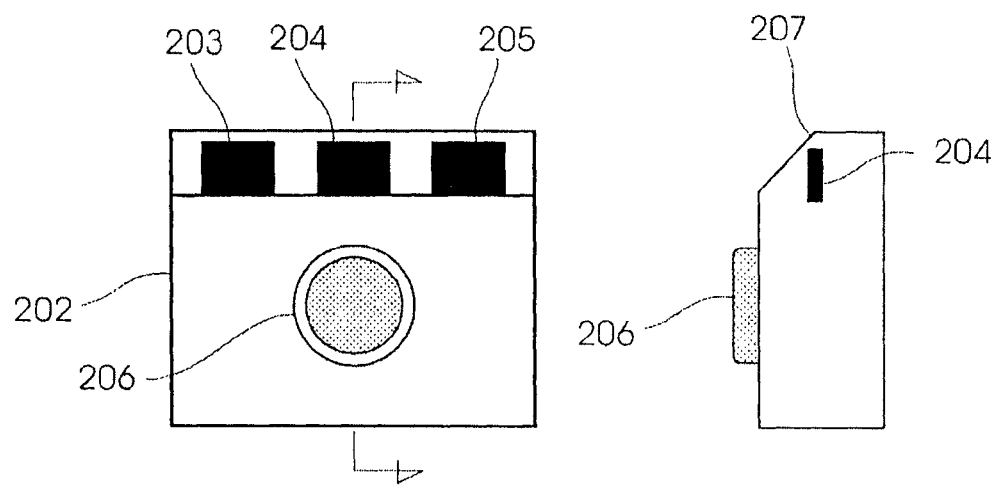
FIG. 23 shows exemplary use of edges in a product housing to provide haptic indication of CSS location to a user.

FIG. 23 illustrates, in an exemplary manner, how edges in the product housing or body may be used to provide haptic feedback which may assist a user to determine the location of a specific CSS. In the embodiment shown, a CSS, consisting of electrodes (203), (204) and (205) and associated circuitry, is contained within a product housing (202), in this case a headlamp. Said electrodes are substantially underneath edge (207) of product housing (202), shown by the cross section taken along line AA'. Therefore, a user wearing thick gloves, for example, may feel for the diagonal face in the body of the headlamp, and then execute a swipe gesture along the top edge (207) of said diagonal face to activate the CSS, and control light source (206). The illustrated embodiment is purely exemplary, and should not serve to be limiting on the present disclosure, with any number of electrodes used to construct the CSS, as well as any number of edges or the orientations thereof possible, and still falling within the scope and spirit of the presently disclosed invention. The invention is also not limited to a specific capacitive sensing technique or electrode arrangement, and may use charge transfer, relaxation oscillator, impedance voltage division or any other relevant capacitive sensing technique to sense self or mutual capacitance in embodiments of the present invention.

Figure 24:
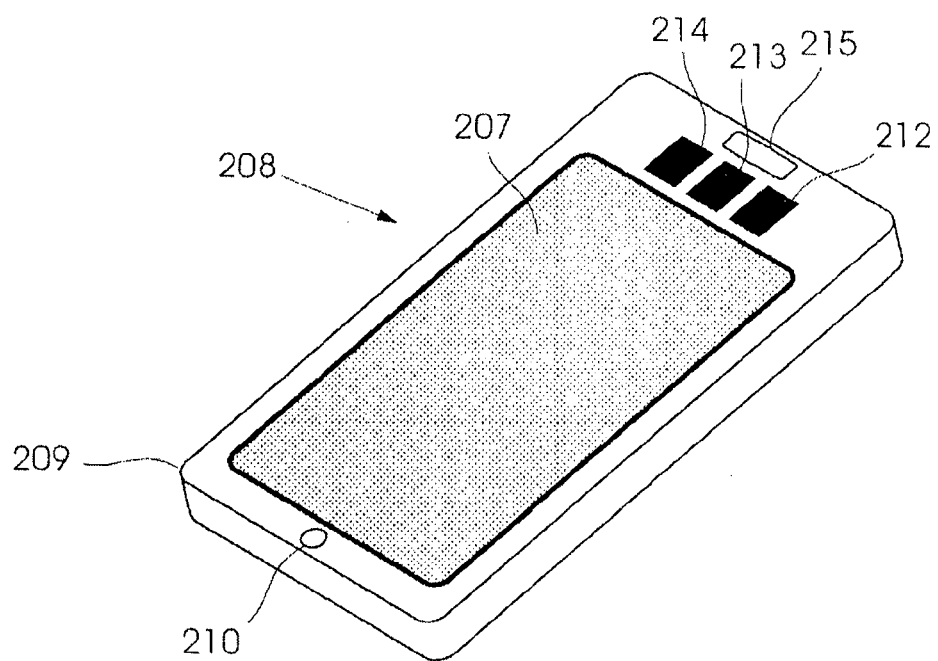
FIG. 24 shows the exemplary use of a CSS to facilitate the function of on-ear detection in conjunction with a user interface locking/unlocking function.

FIG. 24 illustrates an exemplary embodiment where a CSS is employed in a mobile telephone (208). Said telephone has a casing (209), a touchscreen (211), a microphone opening (210) and a speaker opening (215). In the example shown, three capacitive sensing electrodes (212), (213) and (214) are used, along with the required circuitry, not shown, to form a CSS. Said CSS are used to facilitate both the on-ear detection and locking/unlocking function typically found in state of the art mobile telephones. When a user receives a call, typical user interfaces of state of the art phones will allow the user to answer said call via the user interface, independent of whether the phone is in a locked or unlocked state. Normally, such an answering action is followed by the user placing telephone (208) against or close to his/her ear. This may be detected via the resulting change in measured capacitance of electrodes (212), (213) and (214). The requirement for the annunciation of an on-ear event may be based on a specific change in measured capacitance for only one of the three electrodes, or any combination of two electrodes, or all three electrodes, due to the pre-knowledge that a call has been answered. Once an on-ear event has been detected and declared, said telephone may de-activate it's visual output, or use the information to ignore all further user interface inputs until the on-ear event is cleared. When the user ends said call, electrodes (212), (213) and (214) may be used to facilitate a CSS, as taught by the preceding disclosure. Said CSS may be used to lock or unlock said telephone's user interface. By performing a specific swiping gesture on or in proximity to the CSS, the user may lock or unlock said user interface. Said swiping gesture may be any one or combination of the large number of possible gestures, some of which has been described during the earlier discourse of the present disclosure. Further, surface patterns in the casing (209), similar to that disclosed earlier, or others, may be used in the vicinity of electrodes (212), (213) and (214) to provide haptic feedback and guidance to the user concerning operation of the CSS. When mobile telephone (208) is in a state where the user interface is unlocked or locked, one or more of the electrodes may be used to facilitate a blocking function on the logic state of the output of the CSS. For instance, when a call is being answered, said telephone may prohibit any change in the output of the CSS, to prevent inadvertent unlocking of the user interface. Or when said telephone's user interface is in an unlocked state, and the user is engaging touchscreen (211), sufficient capacitance change in any one of the electrodes (212), (213) and (214) which has been placed closer to said touchscreen may be used to determine that the user is probably engaging said touchscreen, and not said CSS, and therefore prohibit any change in the logic state of the CSS's output. In the above, electrodes (212), (213) and (214) may be used to sense changes in either self-capacitance or mutual capacitance.

Figure 25:
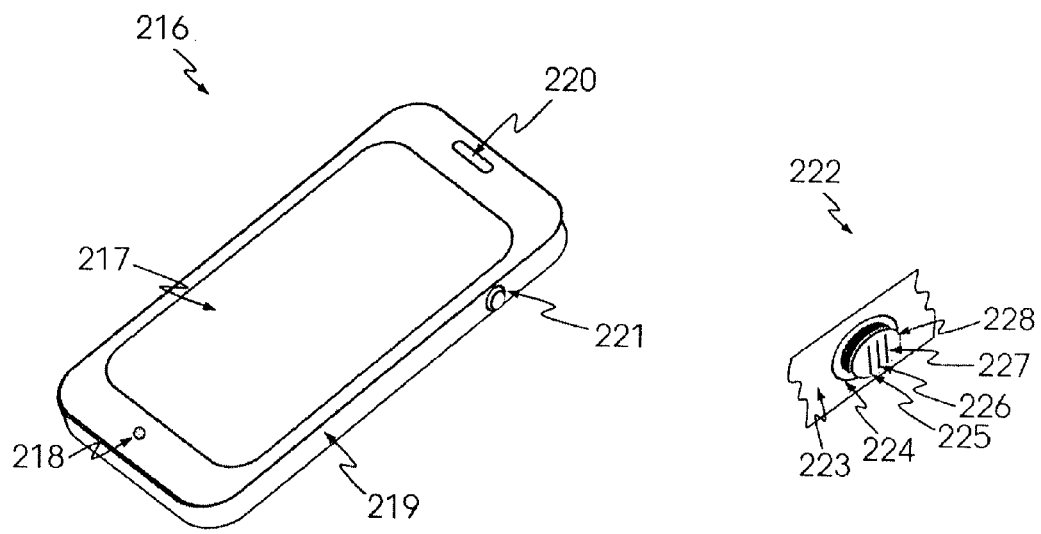
FIG. 25 shows an exemplary embodiment of a CSS button on a mobile phone.

In FIG. 25, yet another exemplary embodiment of the present invention in a mobile telephone is shown. At (216), a mobile telephone with a touchscreen (217), a microphone opening (218), a casing (219) and a speaker opening (220), typical of mobile telephones presently commercially available, is illustrated. In addition, a CSS based button (221), as taught by the present invention, is situated on the side of said telephone, as an exemplary location. At (222), a more detailed view of said CSS based button is presented. CSS based button (228) typically has dimensions to allow its outer face to fit into an area on the order of 6 mm by 6 mm, and is contained by a recess (224) in the side wall (223) of the casing of said mobile telephone. Button (228) is supported by a spring loaded structure with similar characteristics to a snap dome structure, and as such, if a user applies more than a predetermined minimum pressure to said button, it will suddenly deflect significantly, and may provide a tactile click, as users have become accustomed to in mobile products. Said spring loaded structure also ensures that CSS based button (228) has some resilience to deflection, and returns to its starting position. A number of capacitance sensing electrodes will typically be situated on the outer face of said CSS based button (228), in the present exemplary embodiment, three electrodes are utilized as shown by (225), (226) and (227) to sense up/down swipes. Said electrodes may be used to sense proximity events, touches with less than a predetermined minimum pressure, touches with more than a predetermined minimum pressure and swipe gestures. When a user exerts more than a predetermined minimum pressure, resulting in rapid deflection of CSS based button (228), the event may be detected via normal electrical contact make or break means, or via capacitive sensing means, according the present invention. Specifically, means as taught in WO 2011/130755, by the present inventor, and hereby incorporated in its entirety, may be used to effect an inverse change in measured mutual capacitance when said button is pressed with more than a predetermined minimum pressure, said inverse being relative to the change in measured mutual capacitance when pressure less than a predetermined minimum is applied to said button.

According to the present invention, electrodes (225), (226) and (227) may be used to detect swipes in a vertical direction, that is, in the mobile telephone's lengthwise direction. Users may thus swipe up or down over CSS based button (228). Further, the present invention teaches that electrodes (225), (226) and (227) and the associated capacitive sensing circuitry of said CSS based button (228) may be such as to allow swipe or motion detection based on the movement of a user's fingerprint ridges and valleys, as taught in provisional filing ZA 2012/05814, titled "Fingerprint based capacitive motion sensor" by the present inventor, and hereby incorporated in its entirety.

Exemplary operation of CSS based button (228) may be as follows. It may be used as a proximity sensor, and wake said mobile telephone from a power saving sleep mode upon detection of a proximity event followed by a touch with less than a minimum pressure, as an example. During a telephone call, a user may swipe up or down over said CSS based button (228) to adjust speaker volume up or down, respectively. To navigate a displayed list of items, a user may make a partial swipe over said CSS based button (228), and pause with a prolonged touch during the swipe. This will result in a scrolling function being performed, as an example. To halt the scrolling function at a specific point in said displayed list of items, the user may simply remove his/her finger from CSS based button (228). Alternatively, a user may navigate a displayed list of items by a number of consecutive swipes, within a certain period, in a particular direction. The present invention further teaches that said user may use a number of, consecutive swipes in a particular direction to control movement of a displayed cursor or pointer, wherein each detected swipe results in a step by said cursor or pointer in the direction of said detected swipe. The above may be followed by a tap or a touch with more than a minimum pressure to select. As is evident, a rich collection of possible user gestures, that may control a large number of functions of a mobile telephone, or another mobile electronic device, may be facilitated by a CSS based button as illustrated by FIG. 25, if one takes into account that it can sense swipes in two directions, taps, double taps, touches of longer duration and touches with more than minimum pressure. Further, the present invention also teaches that it may be used as a very effective lock and unlock interface if used to sense swipes based on the motion detection of fingerprint ridges and valleys. For example, to unlock said mobile telephone, a user may simply swipe his/her fingerprint over CSS based button (228). By using information characteristic to fingerprint ridges and valleys, as described in ZA 2012/05814, said CSS based button (228) may accurately determine if a seemingly valid swipe gesture was made by a fingerprint or by other non-valid material such as that of a jacket pocket, preventing erroneous unlocking of said mobile telephone.

In the aforementioned and the presented claims, a swipe or swiping action means a specific sequence of actions by an engaging probe within a certain period, said probe directed by a user, and where said probe may be a member of the user, for example a finger.

The invention claimed is:

1. An electronic switch, for use in a product with two or more main loads or functions, where the switch comprises an integrated circuit with microprocessor functionality and capacitive sensing circuitry, wherein the integrated circuit can detect and annunciate a specific movement sequence of a user's finger across two or more capacitive sensing electrodes, said sequence forming a swipe event, wherein the integrated circuit detects, subject to timing constraints to exclude swipe events that are too fast or too slow and subject to a defined order of sequentially registered minimum predefined changes in capacitive measurement values for the respective capacitive sensing electrodes, a valid swipe event and a swipe direction, and with the resulting action taken by the integrated circuit, based on the detected valid swipe event and direction, conforming to the following protocols:
with the main loads/functions in a de-activated state then, based on the detection of a first valid swipe event in a first direction, the electronic switch activates a first main load/function, whereas with the detection of a first valid swipe event in a second direction the electronic switch activates a second main load/function;
another valid swipe event in the same direction as the first valid swipe event that activated the first/second main load/function, and within a predefined period, will affect a mode or operation of said activated first/second main load/function;
whereas, another valid swipe event in a direction opposite to the first/second valid swipe direction, will de-activate the first/second main load/function that was activated as a result of the first valid swipe event.

2. The electronic switch of claim 1 wherein the detection of a prolonged user touch on a capacitive sensing electrode(s), by the integrated circuit, subsequent to a valid swipe event detection, results in a scrolling or continuous stepping function of modes or functions being selected.

3. The electronic switch of claim 1 wherein from a de-activated state of a product, the detection by the integrated circuit of a valid swipe event is required for the selection and activation of an operating mode that endures until cancelled by further user interaction with the electronic switch.

4. The electronic switch of claim 1 wherein the detection by the integrated circuit of proximity or touch activation of individual capacitive sensing electrodes subsequent to detection by the integrated circuit of a valid swipe event will result in the selection or activation of function(s) or load(s) by the integrated circuit in a way that depends on the initial valid swipe event direction, the electrode activated by the user and/or the timing associated with the activation, and on the number of proximity or touch activations, said timing comprising any of the following: the period since the detection of said valid swipe event, the period of proximity or touch activation, and the period between successive proximity or touch activations.

5. The electronic switch of claim 1, wherein a lock mode is implemented by said integrated circuit on a product user interface that requires additional measures other than detection by said integrated circuit of a valid swipe event to activate or unlock the product or a load, and wherein such additional measures comprise at least one of the following:
the detection by said integrated circuit of a prolonged user touch on the capacitive sensing electrodes prior to detection of a valid swipe event within a time window, wherein the start of said window is indicated to the user
detection by said integrated circuit of a specific sequence of electrode touches by a user before detection of a valid swipe event
detection by said integrated circuit of a sequence of multiple valid swipe events with time and directional constraints.

6. The use of shielding or blocking electrodes in the electronic switch of claim 1, with the objective to improve immunity against inadvertent activation based on user action detections as measured by the integrated circuit using capacitive sensing, wherein such shielding or blocking electrodes are of an active type, are tied to system ground, or wherein detection by said integrated circuit of a user touch on said shielding or blocking electrodes results in the integrated circuit selecting to ignore concurrent touch events on other capacitive sensing electrodes.

7. The electronic switch of claim 5, wherein during said lock mode, the integrated circuit performs capacitive measurements at longer time intervals apart, and requires prolonged user touch events as part of said additional measures required for activating or unlocking the product or load.

8. The electronic switch of claim 1, wherein a demonstration mode is implemented that only allows unlatched or temporary activation of a load for the duration that said integrated circuit detects a user touch on a sense electrode, and wherein the demonstration mode is disabled and normal functionality enabled when a first valid swipe event is recognized, and whereas packaging for selling the product is designed such that a valid swipe event cannot be completed whilst the product is inside undamaged packaging.

9. The electronic switch of claim 1, with the addition of at least one dedicated capacitive sense electrode for function/operation mode selection, and which only becomes responsive to user interaction for a limited period after detection and annunciation of a valid swipe event by the integrated circuit.

10. The electronic switch of claim 1, where the surface physical form or structure of a dielectric material between an engaging probe, such as a user's finger or a stylus, and the capacitive sensing electrode, is used to guide the engaging probe towards the required starting point for a valid swipe event, and/or along the required direction or path for a valid swipe event.

11. The electronic switch of claim 1 wherein detection by the integrated circuit of a valid swipe event more than a predetermined time after detection by the integrated circuit of a preceding valid swipe event, will result in a switch-OFF action being selected by the integrated circuit, irrespective of the swipe direction detected by said integrated circuit.

12. The electronic switch of claim 1, which has only two or three capacitive sensing electrodes per dimension, wherein said electrodes facilitates sufficient collection of capacitive measurement information for the differentiation by the integrated circuit between ridges and valleys of a fingerprint pattern, and wherein such information is used by the integrated circuit to determine at least one of the following parameters:
- direction of a valid swipe event
- speed of a valid swipe event
- length of a valid swipe action
- repetition rate of valid swipe events
- number of valid swipe events.

13. The electronic switch of claim 1, where the product is a headlamp or a flashlight, and the first main load is a white light source and the second main load is a red light source.

14. The electronic switch of claim 2, where the product is a headlamp or a flashlight.

15. The electronic switch of claim 3, where the product is a headlamp or a flashlight.

16. The electronic switch of claim 4, where the product is a headlamp or a flashlight.

17. The electronic switch of claim 5, where the product is a headlamp or a flashlight.

18. The electronic switch of claim 9, where the product is a headlamp or a flashlight.

19. The electronic switch of claim 4, where the user may pause his/her finger on a sensing electrode after detection by said integrated circuit of a valid swipe event to lower or raise a window, with the continued movement of the window halting when said integrated circuit detect that the user removed his/her fingers from the touch electrodes.

20. A method of operating an electronic switch for a product with at least two main loads or functions, wherein the electronic switch comprises a microprocessor with capacitive sensing circuitry and wherein the method includes the steps of using the microprocessor to detect and annunciate a specific movement sequence of a user's finger across two or more capacitive sensing electrodes, said sequence forming a swipe event, utilizing timing constraints to exclude swipe events that are too fast or too slow, sequentially registering a minimum predefined change in measurement value for the respective capacitive sensing electrodes to result in a valid swipe event being detected by the microprocessor, and with the electronic switch using the capacitive measurement swipe information to select and control, or activate a first load, mode or function in the product according to the direction of the detected valid swipe event and wherein the load, mode or function selected and controlled, or activated in association with the direction of a subsequent detected valid swipe event is affected by the direction of the valid swipe event that activated the first load, mode or function.

* * * * *